United States Patent
Batruni

(10) Patent No.: US 8,370,113 B2
(45) Date of Patent: Feb. 5, 2013

(54) LOW-POWER AND LOW-COST ADAPTIVE SELF-LINEARIZATION SYSTEM WITH FAST CONVERGENCE

(75) Inventor: Roy G. Batruni, Danville, CA (US)

(73) Assignee: Netlogic Microsystems, Inc., Irvine, CA (US)

( * ) Notice: Subject to any disclaimer, the term of this patent is extended or adjusted under 35 U.S.C. 154(b) by 163 days.

(21) Appl. No.: 12/152,843

(22) Filed: May 16, 2008

(65) Prior Publication Data

US 2008/0270082 A1 Oct. 30, 2008

Related U.S. Application Data

(63) Continuation-in-part of application No. 11/728,725, filed on Mar. 26, 2007, now Pat. No. 7,917,337.

(60) Provisional application No. 60/848,425, filed on Sep. 29, 2006, provisional application No. 60/930,750, filed on May 18, 2007.

(51) Int. Cl.
H03F 1/32 (2006.01)
H03F 1/12 (2006.01)
H03F 1/18 (2006.01)
H03F 1/26 (2006.01)

(52) U.S. Cl. ......... 702/190; 702/189; 702/194; 702/199

(58) Field of Classification Search .............. 702/66, 702/73, 76, 94, 101, 117, 150, 183, 190; 327/549; 330/51, 149; 375/296; 455/126
See application file for complete search history.

(56) References Cited

U.S. PATENT DOCUMENTS

| | | |
|---|---|---|
| 4,288,872 A | 9/1981 | Tamburelli |
| 4,412,341 A | 10/1983 | Gersho et al. |
| 4,701,934 A | 10/1987 | Jasper |
| 4,751,730 A | 6/1988 | Galand et al. |
| 4,763,108 A | 8/1988 | Kobayashi |
| 4,926,472 A | 5/1990 | Batruni et al. |
| 4,995,104 A | 2/1991 | Gitlin |
| 5,168,459 A | 12/1992 | Hiller |
| 5,239,299 A | 8/1993 | Apple et al. |
| 5,252,930 A | 10/1993 | Blauvelt |
| 5,294,926 A | 3/1994 | Corcoran |
| 5,537,443 A | 7/1996 | Yoshino et al. |
| 5,568,411 A | 10/1996 | Batruni |
| 5,788,635 A | 8/1998 | Wright et al. |
| 5,793,820 A * | 8/1998 | Vander Mey ................ 375/350 |
| 5,848,105 A | 12/1998 | Gardner et al. |
| 5,864,754 A | 1/1999 | Hotto |
| 5,949,283 A | 9/1999 | Proctor et al. |
| 6,081,215 A | 6/2000 | Kost et al. |
| 6,246,286 B1 | 6/2001 | Persson |
| 6,301,298 B1 | 10/2001 | Kuntz et al. |
| 6,342,810 B1 * | 1/2002 | Wright et al. ................ 330/51 |

(Continued)

OTHER PUBLICATIONS

Batruni, Roy G., "Curling Nonlinear Distortion", Embedded Systems Design, Embedded.com, Aug. 16, 2006, (p. 1, para 4, 7)(p. 4, para 2); downloaded from the Internet http://www.eetimes.com/design/embedded/4025701/Curing-nonlinear-distortion (downloaded on Jun. 13, 2011).

(Continued)

Primary Examiner — Mohamed Charioui
Assistant Examiner — Felix Suarez
(74) Attorney, Agent, or Firm — Sterne, Kessler, Goldstein & Fox P.L.L.C.

(57) ABSTRACT

A signal processing method includes inputting a digital signal, providing a plurality of coefficients; and determining an output. The output is approximately equal to an aggregate of a plurality of linear reference components, and each of the linear reference components is approximately equal to an aggregate of a corresponding set of digital signal samples that is scaled by the plurality of coefficients.

27 Claims, 20 Drawing Sheets

U.S. PATENT DOCUMENTS

| | | | |
|---|---|---|---|
| 6,377,116 | B1 | 4/2002 | Mattsson et al. |
| 6,388,513 | B1 | 5/2002 | Wright et al. |
| 6,522,282 | B1 | 2/2003 | Elbornsson |
| 6,560,447 | B2 | 5/2003 | Rahman et al. |
| 6,570,444 | B2 * | 5/2003 | Wright ............ 330/149 |
| 6,577,731 | B1 | 6/2003 | Sugiyama |
| 6,674,335 | B1 | 1/2004 | Ballantyne |
| 6,765,931 | B1 | 7/2004 | Rabenko et al. |
| 6,798,843 | B1 | 9/2004 | Wright et al. |
| 6,819,279 | B2 | 11/2004 | Pupalaikis |
| 6,856,191 | B2 | 2/2005 | Bartuni |
| 6,885,241 | B2 * | 4/2005 | Huang et al. ............ 330/149 |
| 6,934,341 | B2 | 8/2005 | Sahlman |
| 6,956,517 | B1 | 10/2005 | Baker et al. |
| 6,999,510 | B2 | 2/2006 | Batruni |
| 7,015,752 | B2 * | 3/2006 | Saed ............ 330/149 |
| 7,139,327 | B2 | 11/2006 | Vella-Coleiro et al. |
| 7,199,736 | B2 | 4/2007 | Batruni |
| 7,253,762 | B2 | 8/2007 | Huang et al. |
| 7,336,729 | B2 | 2/2008 | Agazzi |
| 7,342,976 | B2 | 3/2008 | McCallister |
| 7,365,662 | B2 | 4/2008 | Marsili et al. |
| 7,382,985 | B2 | 6/2008 | Roberts et al. |
| 7,386,409 | B2 | 6/2008 | Mueller et al. |
| 7,428,262 | B2 * | 9/2008 | Zancho et al. ............ 375/148 |
| 7,467,172 | B2 | 12/2008 | Druck |
| 7,602,321 | B2 | 10/2009 | Batruni |
| 7,688,235 | B2 | 3/2010 | Batruni |
| 7,693,672 | B2 | 4/2010 | Batruni |
| 7,869,550 | B2 | 1/2011 | Batruni |
| 7,917,337 | B2 | 3/2011 | Batruni |
| 8,032,336 | B2 | 10/2011 | Batruni |
| 8,041,757 | B2 | 10/2011 | Batruni |
| 2004/0027198 | A1 | 2/2004 | Chandrasekaran et al. |
| 2004/0156038 | A1 | 8/2004 | Cao |
| 2004/0164791 | A1 | 8/2004 | Batruni |
| 2004/0233081 | A1 | 11/2004 | Cesura et al. |
| 2004/0263367 | A1 | 12/2004 | Batruni |
| 2005/0212589 | A1 | 9/2005 | Batruni |
| 2005/0212596 | A1 | 9/2005 | Batruni |
| 2005/0219088 | A1 | 10/2005 | Batruni |
| 2005/0219089 | A1 | 10/2005 | Batruni |
| 2005/0243946 | A1 | 11/2005 | Chung et al. |
| 2006/0093050 | A1 | 5/2006 | Strait |
| 2006/0098763 | A1 | 5/2006 | Meyer |
| 2006/0176989 | A1 | 8/2006 | Jensen |
| 2007/0205934 | A1 | 9/2007 | Buisson |
| 2007/0244669 | A1 | 10/2007 | Vogel et al. |
| 2007/0286230 | A1 | 12/2007 | Basu |
| 2008/0082280 | A1 | 4/2008 | Batruni |
| 2008/0082281 | A1 | 4/2008 | Batruni |
| 2008/0082597 | A1 | 4/2008 | Batruni |
| 2008/0084337 | A1 | 4/2008 | Batruni |
| 2008/0288199 | A1 | 11/2008 | Batruni |
| 2008/0291066 | A1 | 11/2008 | Batruni |
| 2011/0314074 | A1 | 12/2011 | Batruni |
| 2012/0029881 | A1 | 2/2012 | Batruni |

OTHER PUBLICATIONS

U.S. Appl. No. 11/728,731 Final Office Action Mailed Aug. 21, 2008.
U.S. Appl. No. 11/728,731 Office Action Mailed Mar. 31, 2008.
U.S. Appl. No. 11/728,731 Office Action Mailed Feb. 13, 2009.
U.S. Appl. No. 11/904,613 Office Action Mailed Oct. 27, 2008.
U.S. Appl. No. 11/728,725 Final Office Action Mailed Apr. 29, 2009.
U.S. Appl. No. 11/728,725 Office Action Mailed Jan. 3, 2008.
U.S. Appl. No. 11/728,725 Office Action Mailed Aug. 5, 2008.
U.S. Appl. No. 11/728,725 Office Action Mailed Sep. 15, 2009.
U.S. Appl. No. 11/728,725 Office Action Mailed May 27, 2010.
U.S. Appl. No. 12/154,157 Office Action Mailed Jul. 29, 2010.
U.S. Appl. No. 11/904,614 Office Action Mailed Jun. 19, 2009.
PCT/US07/20850 International Search Report and Written Opinion Mailed May 5, 2008.
PCT/US07/20820 International Search Report and Written Opinion Mailed Mar. 19, 2008.
PCT/US07/20910 International Search Report and Written Opinion Mailed Sep. 16, 2008.
PCT/US08/06424 International Search Report and Written Opinion Mailed Sep. 8, 2008.
PCT/US08/06433 International Search Report and Written Opinion Mailed Aug. 20, 2008.
PCT/US07/20915 International Search Report and Written Opinion Mailed May 30, 2008.
Chinese Application No. 200780036052.2 Office Action Mailed Jul. 6, 2011.
Elbornsson et al., "Blind Adaptive Equalization of Mismatch Errors in a Time-Interleaved A/D Converter System," *IEEE Transactions On Circuits And Systems-l: Regular Papers*, vol. 51, No. 1, Jan. 2004, pp. 151-158.
EP Application No. 07838913.7 Supplementary Search Report and Search Opinion mailed Mar. 2, 2012, 8 pages.
Office Action mailed Jul. 29, 2010, directed to related U.S. Appl. No. 12/154,157, filed May 19, 2008 (now U.S. Pat. No. 8,032,336).
Notice of Allowance mailed Jul. 6, 2011, directed to related U.S. Appl. No. 12/154,157, filed May 19, 2008 (now U.S. Pat. No. 8,032,336).
Office Action mailed Jun. 20, 2012, directed to co-pending U.S. Appl. No. 13/220,505, filed Aug. 29, 2011; 10 pages.
International Preliminary Report on Patentability and Written Opinion directed to related International Patent Application No. PCT/US08/06424, The International Bureau of WIPO, Geneva, Switzerland, mailed Nov. 24, 2009; 7 pages.
International Preliminary Report on Patentability and Written Opinion directed to related International Patent Application No. PCT/US08/06424, The International Bureau of WIPO, Geneva, Switzerland, mailed Nov. 24, 2009; 5 pages.

* cited by examiner

LOW-POWER AND LOW-COST ADAPTIVE SELF-LINEARIZATION SYSTEM WITH FAST CONVERGENCE

CROSS REFERENCE TO OTHER APPLICATIONS

This application claims priority to U.S. Provisional Patent Application No. 60/930,750, entitled "LOW-POWER AND LOW-COST ADAPTIVE SELF-LINEARIZATION SYSTEM WITH FAST CONVERGENCE," filed May 18, 2007, which is incorporated herein by reference for all purposes.

This application is a continuation in part of U.S. patent application Ser. No. 11/728,725, entitled "ADAPTIVE SELF-LINEARIZATION WITH SEPARATION FILTER," filed Mar. 26, 2007, now U.S. Pat. No. 7,917,337, which claims priority to U.S. Provisional Patent Application No. 60/848,425, entitled "ADAPTIVE SELF-LINEARIZATION: FULL SYSTEM OPERATION AND ARCHITECTURE," filed Sep. 29, 2006, and which is incorporated herein by reference for all purposes.

BACKGROUND OF THE INVENTION

Nonlinearity is a problem present in many signal processing systems. For example, the channel and the devices can introduce nonlinearity to a transmitted signal, thus causing distortion in the output. A typical way of correcting the nonlinearity is by using a training signal with known signal characteristics such as amplitude, phase, frequency, data sequence, and modulation scheme. The nonlinearities in the system will introduce distortion. The received signal is a composite signal of a distorted component, and an undistorted component that corresponds to the ideal, undistorted training signal. During a training period, the training signal is available to the receiver. Filters in the receiver's signal processor are adjusted until the output matches the training signal. This training technique requires that the ideal, undistorted training signal be available during the training period. The technique is sometimes impractical since adding the training to the manufacturing process will increase the cost of the device. Further, system nonlinearities may vary due to factors such as variations in signal paths, power supply, temperature, signal dynamics, Nyquist zone of the signal, and/or aging of components. It is, however, often impractical to re-train the device since the undistorted training signal may no longer be available. It would be desirable, therefore, to be able to more easily compensate for system nonlinearity. It would also be useful if the solution would not significantly increase the cost of the device.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions and/or signals.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Signal separation and linearization is described. In some embodiments, based on an unknown distorted signal that is received, a reference component and a target component are separated from the unknown signal. Based on the separation, self-linearization is performed to compensate for nonlinear distortion and obtain an output signal that is substantially undistorted. As used herein, linearization refers to removing or compensating the nonlinearities in a signal. Self-linearization refers to calibration/linearization that does not require a training signal whose specific characteristics (such as frequency components, amplitudes, phases, data sequence, and/or modulation scheme) are already known to the module receiving the signal. In some embodiments, a persistence filter is included in an adaptive self-linearization module to generate the reference component and help performing separation.

Figure 1A:
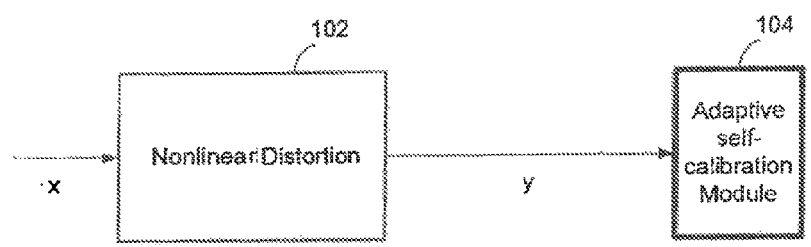
FIG. 1A is a system diagram illustrating an embodiment of a system that includes an adaptive self-linearization module.

FIG. 1A is a system diagram illustrating an embodiment of a system that includes an adaptive self-linearization module. An unknown input signal x is distorted by block 102, generating a distorted signal y. Block 104 represents nonlinear distortion introduced by the transmission media, electronic circuits, or any other source. An adaptive self-linearization module 104 is configured to correct for the distortion based on the received signal y.

Figure 1B:
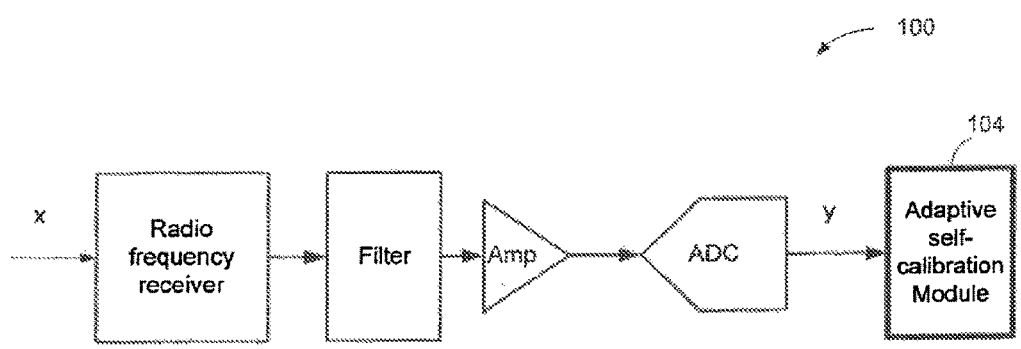
FIG. 1B is a system diagram illustrating an embodiment of a wireless receiver that includes an adaptive self-linearization module.

FIG. 1B is a system diagram illustrating an embodiment of a wireless receiver that includes an adaptive self-linearization module. The system is used to illustrate one application of the adaptive self-linearization module, although many other applications and configurations exist. In the example shown, system 100 is a receiver. The system has a number of components including a radio frequency receiver, a filter, an amplifier, an analog to digital converter. Each of the components has some nonlinear characteristics, causing nonlinear distortion to the input signal. An adaptive self-linearization module 104 is configured to correct for nonlinearities in the receiver electronics, as well as the nonlinearities in the transmission channel. The adaptive self-linearization module 104 can also be used to correct nonlinearities in other systems where an input signal is distorted by nonlinearity introduced by device components and/or transmission media. For example, the adaptive self-linearization module 104 is sometimes included in transmitters, amplifiers, analog to digital converters, and many other types of electronic circuits to correct for system nonlinearities.

Figure 2:
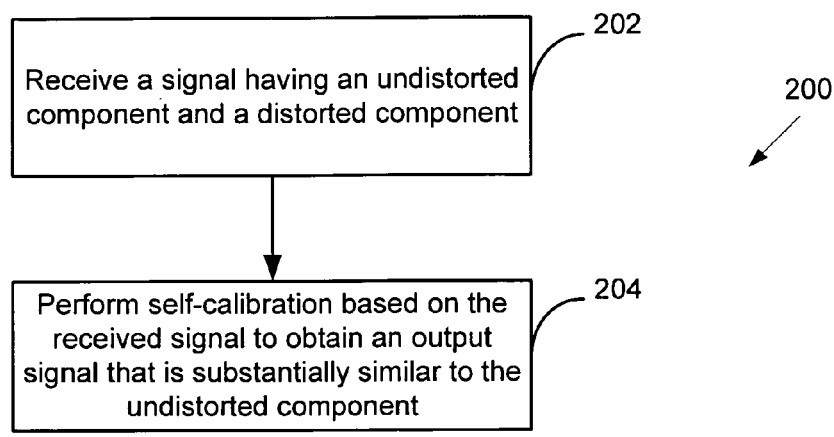
FIG. 2 is a flowchart illustrating an embodiment of a signal processing process.

FIG. 2 is a flowchart illustrating an embodiment of a signal processing process. Process 200 may be implemented on adaptive self-linearization module 104 of system 100. The process initiates when an unknown signal having an undistorted, ideal component and a distorted component is received (202). The signal is said to be unknown with respect to the receiver of the signal since specific characteristics that define the undistorted component of the signal, such as amplitude, phase, signal frequency, data sequence, or modulation scheme are not necessarily available to the receiver. In other words, the receiver does not necessarily have direct access to the undistorted component, nor is the receiver necessarily able to reproduce the undistorted component without further linearization. Self-linearization, sometimes also referred to as blind linearization, is performed based on the received signal to obtain an output signal that is substantially similar to the undistorted component (204). A training signal with known signal characteristics is not required. Thus, the nonlinearities in the system can be corrected while the system is operating in the field. The linearization can be done in real time since it requires no more than a few hundred milliseconds from the time an unknown signal is received. The nonlinear characteristics of the system may change during operation due to nonlinearity causing factors such as variations in the signal source, the paths, the power supply, temperature, signal dynamics, Nyquist zone of the signal, sampling frequency, aging of components, component value tolerances, etc. The adaptive self-linearization module 104 can repeatedly or continuously adapt to correct the nonlinearities despite changes in any of these factors. Further, the operation of the adaptive self-linearization module 104 is independent of the modulation scheme or encoding scheme of the received signal.

Figure 3A:
FIGS. 3A-3C are frequency domain signal spectrum diagrams illustrating an example of nonlinear distortion in a signal.
Figure 3B:
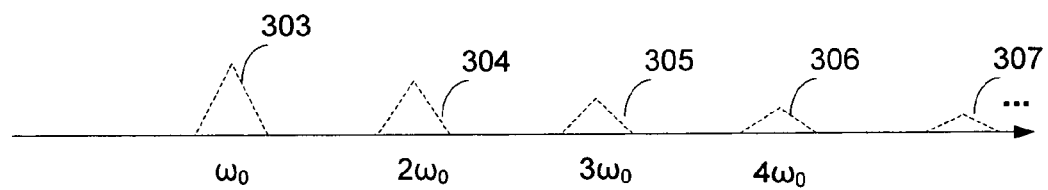
Figure 3C:
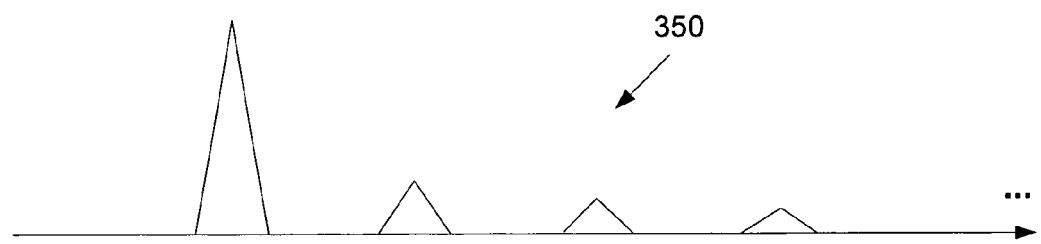

FIGS. 3A-3C are frequency domain signal spectrum diagrams illustrating an example of nonlinear distortion in a signal. In FIG. 3A, signal 300 is an ideal, undistorted signal x centered at $\omega_0$. Nonlinear characteristics of the system lead to distorted components, which are shown in FIG. 3B. The distorted components occur at integer multiples of center frequency $\omega_0$. The resulting signal to be received and processed by the adaptive self-linearization module is shown in FIG. 3C.

It is assumed that the distortion signal can be expressed using a Taylor series. Even harmonics such as 304 and 306 are caused by distortion terms that are even powers of the signal ($x^2$, $x^4$, etc.). The even harmonics are relatively easy to remove since they are outside the fundamental frequency band of the desired signal. Odd harmonics such as 303, 305, and 307 are caused by distortion terms that are odd powers of the signal ($x^3$, $x^5$, etc.). It is more difficult to remove the odd harmonics since harmonic 303 lies within the fundamental frequency band of the desired signal. As will be shown in more detail below, the adaptive self-linearization module is able to approximately produce the distorted components, thereby approximately determine the ideal, undistorted signal 300. Adaptive self-linearization can be performed based on an unknown signal received while the device is operating (as opposed to using a known training signal). Further, an adaptive self-linearization module allows the device to be calibrated regardless of variations in the nonlinearity causing factors.

Figure 4A:
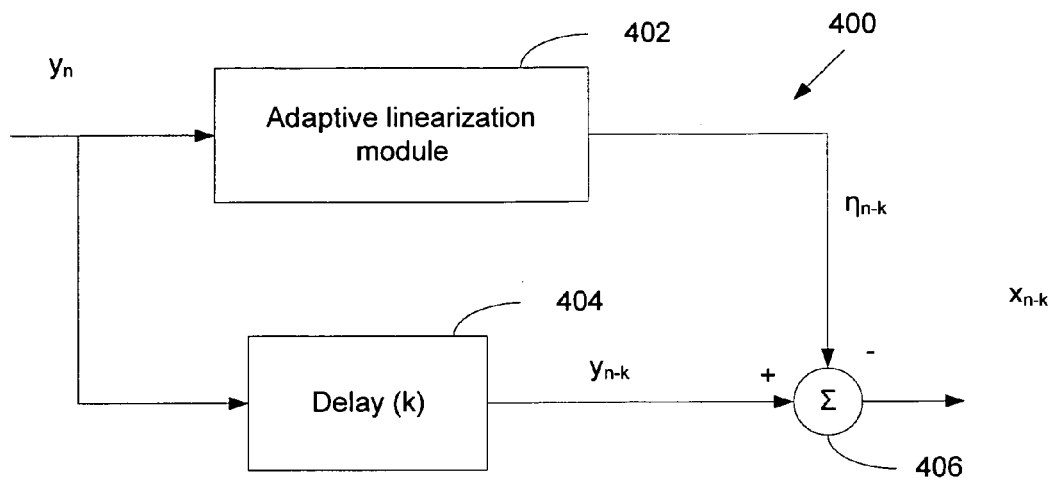
FIG. 4A is a diagram illustrating an embodiment of an adaptive self-linearization module.

FIG. 4A is a diagram illustrating an embodiment of an adaptive self-linearization module. In the example shown, module 400 includes an adaptive linearization module 402 and a delay component 404. Based on its input $y_n$, the adaptive linearization module configures its internal filters to generate an output that approximates the distorted component. Since the adaptation process leads to a delay of k samples in the output, the output is denoted as $\eta_{n-k}$. Details of how the adaptation is made are described below. $y_n$ is sent to a delay module to obtain a delayed version, $y_{n-k}$. Combiner 406 combines $\eta_{n-k}$ and $y_{n-k}$ to obtain the desired, linearized signal component $x_n$. As used herein, combining may be addition or subtraction.

Figure 5A:
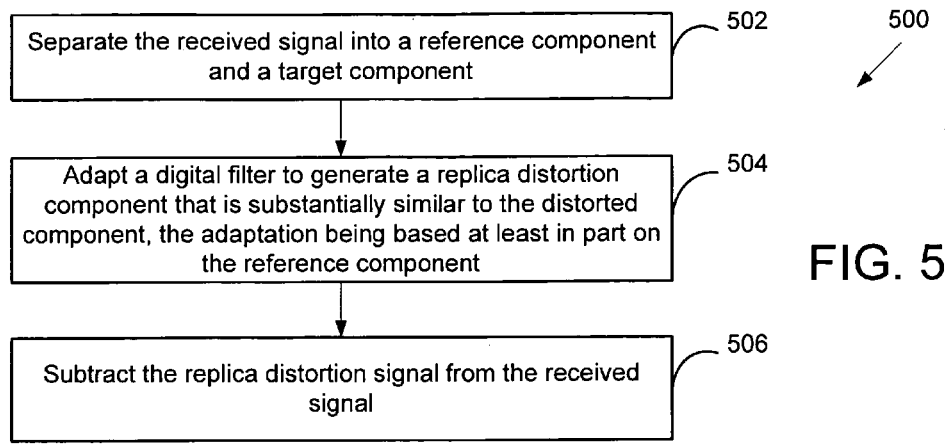
FIG. 5A is a flowchart depicting an embodiment of an adaptive self-linearization process.

FIG. 5A is a flowchart depicting an embodiment of an adaptive self-linearization process. Process 500 shown in the example may be implemented on an adaptive self-linearization module such as 400. During the process, an unknown distorted signal is separated into a reference component and a target component (502). The reference component, sometimes referred to as the offending signal, includes an estimate of one or more signal components that cause the nonlinear distortion in the unknown distorted signal. In some embodiments, the reference component includes an aggregated version of the undistorted component as well as the harmonics within the frequency band of the undistorted component. The harmonics are relatively small and their effects can be ignored for practical purposes. In some embodiments, the reference component includes one or more noise signals in a frequency band separate from that of the desired signal. The target component is the difference between the input signal and the reference component. A digital filter is adapted to generate a replica distortion signal that is substantially similar to the distorted component. The adaptation is based at least in part on the reference component and the target component (504). By separating the reference and target components, the system can train its filter based on a received signal whose characteristics are not known prior to the training. The replica distortion signal is subtracted from the unknown distorted signal to generate the distortion corrected output (506).

Figure 6:
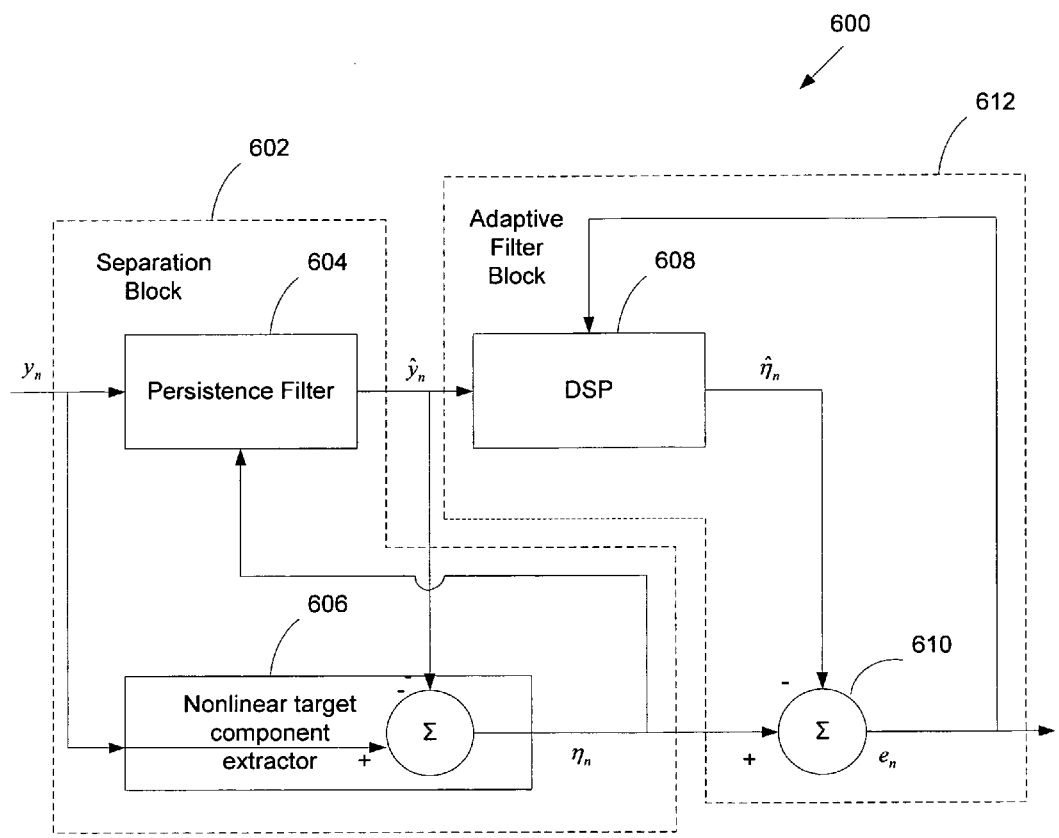
FIG. 6 is a diagram illustrating details of an embodiment of an adaptive linearization module.

FIG. 6 is a diagram illustrating details of an embodiment of an adaptive linearization module. In the example shown, system 600 includes a separation block 602 and an adaptive filter block 612. $y_n$ is a received signal with distortion. The signal is sent to separation block 602, which includes a persistence filter 604 and a nonlinear signal extractor 605. As will be shown in more detail below, the separation block is configured to extract from the input signal $y_n$ a reference component $\hat{y}_n$. In this example, $\hat{y}_n$ is a linearly enhanced version of the input signal. The target component $\eta$ is a function of the received signal and its history. At each time instance, $\eta_n$ is expressed as $y_n - \hat{y}_n$.

For example, let the received signal $y_n = 1.001\, x_n + 0.01\, x_n^3$, where $x_n$ is the desired undistorted component, and $0.001\, x_n + 0.01\, x_n^3$ is the distorted component. A properly configured separation filter will produce a reference component $\hat{y}_n$ that is approximately $kx_n$ (k being a value close to 1), and a target component $\eta_n$ that is $y_n - kx_n$.

In some embodiments, the nonlinear signal extractor further includes a delay element to give the input the same amount of delay as the separation filter. In some embodiments, the nonlinear signal extractor optionally includes a band pass filter, a low pass filter, or a high pass filter. The additional filter is appropriate, for example, in applications where the frequency band of the reference component is known.

Returning to FIG. 6, $\hat{y}_n$ and $\eta_n$ are both sent to an adaptive filter block 612, which includes an adaptive nonlinear digital signal processor (DSP) 608. The adaptive nonlinear DSP is sometimes implemented using an adaptive nonlinear filter. DSP 608 may be implemented using any suitable techniques, such as techniques described in U.S. Pat. No. 6,856,191 by Batruni entitled "NONLINEAR FILTER" and U.S. Pat. No. 6,999,510 by Batruni entitled "NONLINEAR INVERSION", both of which are herein incorporated by reference for all purposes. The patents incorporated by reference describe techniques for building nonlinear filters using linear elements, and for adapting such nonlinear filters to achieve desired transfer characteristics.

The DSP's inputs include the reference component $\hat{y}_n$ and a feedback error signal $e_n$ that is the difference between the target component $\eta_n$ and the DSP's output $\hat{\eta}_n$. The DSP is configured to use $\hat{y}_n$ as its input and $\eta_n$ as its training signal to adapt its filter coefficients and drive the error signal to a predetermined level. The filter coefficients of the DSP's digital filters may be adapted using adaptive techniques including Least Mean Squares (LMS), Recursive Least Squares (RLS), or any other suitable adaptive techniques. The DSP adapts to implement a filter having a transfer function that is approximately the same as the nonlinear transfer function of the system, so that eventually the DSP's output $\hat{\eta}_n$ is about the same as $\eta_n$. In other words, the DSP's adapted transfer function approximately corresponds to the transfer function representing the relationship of the distorted component with respect to the undistorted component. Assuming that the distorted component at the fundamental frequency is relatively small (e.g., $0.001\, x_n$ as in the example discussed above), its effect is negligible and therefore is for all practical purposes ignored. In the above example, DSP 608 will adapt its filter parameters such that a transfer function of approximately $0.01\, x_n^3$ is obtained.

In the embodiment shown, the error signal of the DSP is expressed as:

$$e_n = \eta_n - W_n^T \hat{Y}_n \quad (1)$$

where $W_n^T = [w_n\ w_{n-1}\ \ldots\ w_{n-N+1}\ w_{n-N}]$ are the nonlinear coefficients and $\hat{Y}_n^T = [\hat{y}_n\ \hat{y}_{n-1}\ \ldots\ \hat{y}_{n-N+1}\ \hat{y}_{n-N}]$ is the nonlinear filter's input vector.

The nonlinear coefficients are expressed using the following general form:

$$w_n = a_n \hat{y}_n + b_n + \sum_{j=1}^{K} c_{j,n} \left| A_{j,n}^T \hat{Y}_n + \beta_{j,n} \right| \quad (2)$$

$$= a_n \hat{y}_n + b_n + \sum_{j=1}^{K} c_{j,n} (A_{j,n}^T \hat{Y}_n + \beta_{j,n}) \lambda_{j,n}$$

where $$\lambda_{j,n} = \text{sign}(A_{j,n}^T \hat{Y}_n + \beta_{j,n}) \quad (3)$$

$$\hat{Y}_n = [\hat{y}_{n+M}\, \hat{y}_{n+M-1}\ \ldots\ \hat{y}_n\ \ldots\ \hat{y}_{n-M+1}\, \hat{y}_{n-M}] \quad (4)$$

$$A_{j,n}^T = [\alpha_{M,n} \alpha_{M-1,n}\ \ldots\ \alpha_{0,n}\ \ldots\ \alpha_{-M+1,n} \alpha_{-M,n}] \quad (5)$$

The coefficients have a time index n because the filter is adaptive and therefore time-varying. The nonlinear coefficients are adapted as follows:

$$A_{j,n+1}^T = A_{j,n}^T + \mu c_{j,n} \lambda_{j,n} \hat{Y}_n e_n \hat{y}_n \quad (6)$$

$$\beta_{j,n+1} = \beta_{j,n} + \mu c_{j,n} \lambda_{j,n} e_n \hat{y}_n \quad (7)$$

$$c_{j,n+1} = c_{j,n} + \mu |A_{j,n}^T \hat{Y}_n + \beta_{j,n}| e_n \hat{y}_n \quad (8)$$

$$a_{j,n+1} = a_{j,n} + \mu \hat{y}_n e_n \hat{y}_n \quad (9)$$

$$b_{j,n+1} = b_{j,n} + \mu e_n \hat{y}_n \quad (10)$$

Returning to FIG. 6, separation block 602 employs persistence filter 604 for separating the reference component from the received signal. The persistence filter is designed to boost the linear signal components and attenuate the noise and nonlinear signal components in the received signal. An analogy to the persistence filter is a camera shutter, which allows light to pass for a period of time in order to capture the stationary image. The background images that are non-stationary over this period of time become blurry. Like a camera shutter, over a period of time, the persistence filter captures the persistent portion of an input signal and removes the non-persistent portion. The persistence filter operates on pseudo stationary input signals that are not rapidly changing (for example, a signal that is stationary for at least a few milliseconds). For a pseudo stationary input signal, the persistent portion is the average of the desired reference component, which is relatively stable and enhances over time. In some embodiments, the persistence filter is designed as an averaging, linear filter that emphasizes the undistorted signal over noise, and emphasizes linear signal components over nonlinear distortion.

Figure 7:
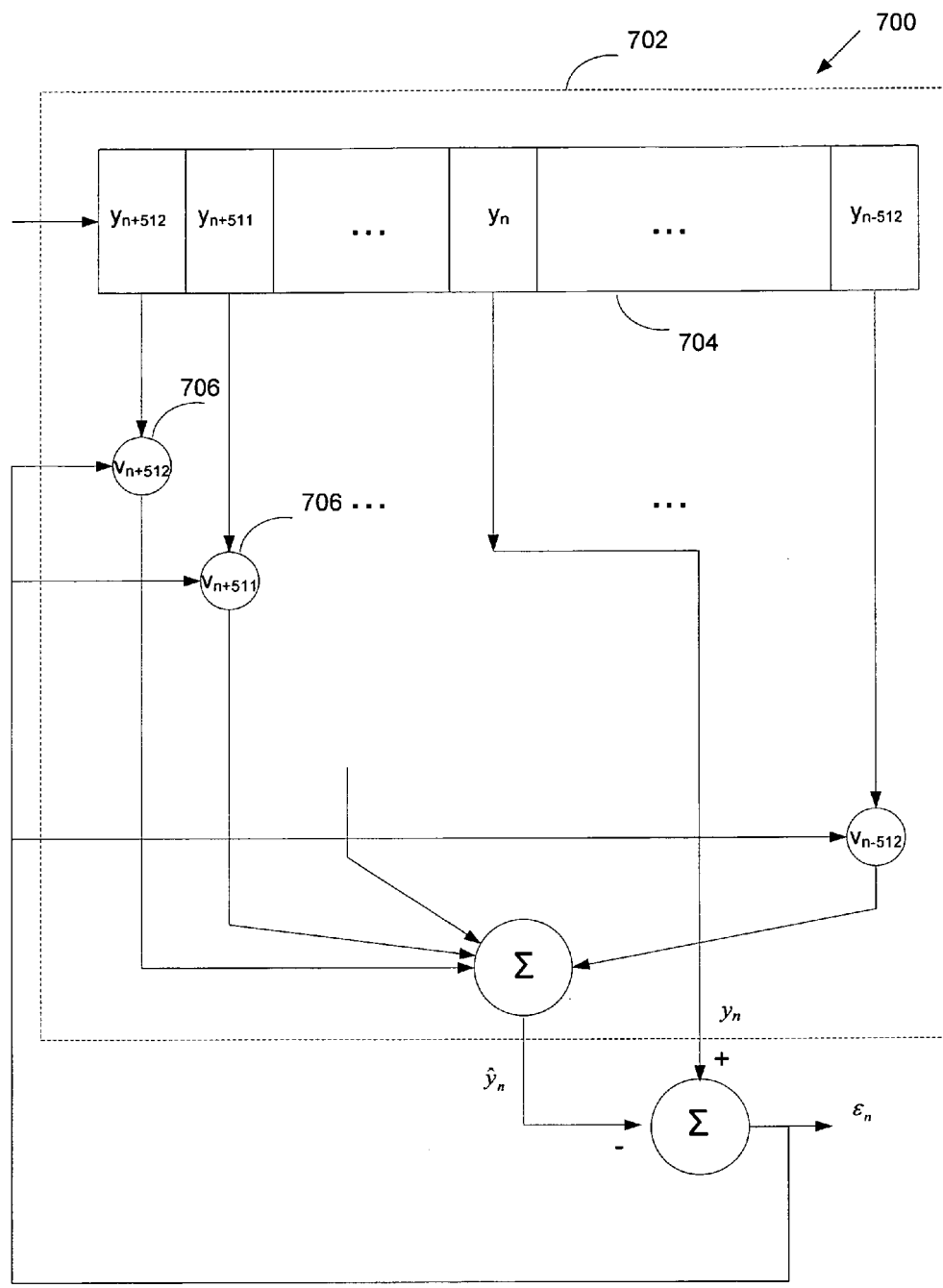
FIG. 7 is a diagram illustrating an embodiment of a separation block.

FIG. 7 is a diagram illustrating an embodiment of a separation block. In this example, separation block 700 includes a persistence filter 702, which includes a delay line 704 to which the input $y_n$ is sent, and a plurality of coefficient multipliers 706. The number of taps in the delay line is represented as $N=2K+1$. In the example shown, $K=512$, which means that the delay line has 1025 taps for delays of 0, 1, 2, ... 1024. Each $y_i$ ($i=n+512, n+511, \ldots, n-511, n-512$) is scaled by multiplying with an adaptable coefficient $v_i$. The multiplication results are summed, producing the linear reference component $\hat{y}_n$. The center tap value $y_n$ is selected, and $\hat{y}_n$ is subtracted from $y_n$ to produce an error $\epsilon_n$. In this case, $\epsilon_n$ corresponds to target $\eta_n$. The error is fed back to update coefficients $v_i$. An adaptive algorithm such as LMS or RLS is used to update the coefficients until $\epsilon_n$ approaches some predefined threshold value. The separation block is configured to receive the input $y_n$, and aggregate $y_n$ over a period of time to produce an aggregate signal that is substantially similar to the undistorted component. The aggregate signal is considered substantially similar when $\epsilon_n$ meets some predefined threshold value. The aggregate signal is then subtracted from the received input.

Figure 8:
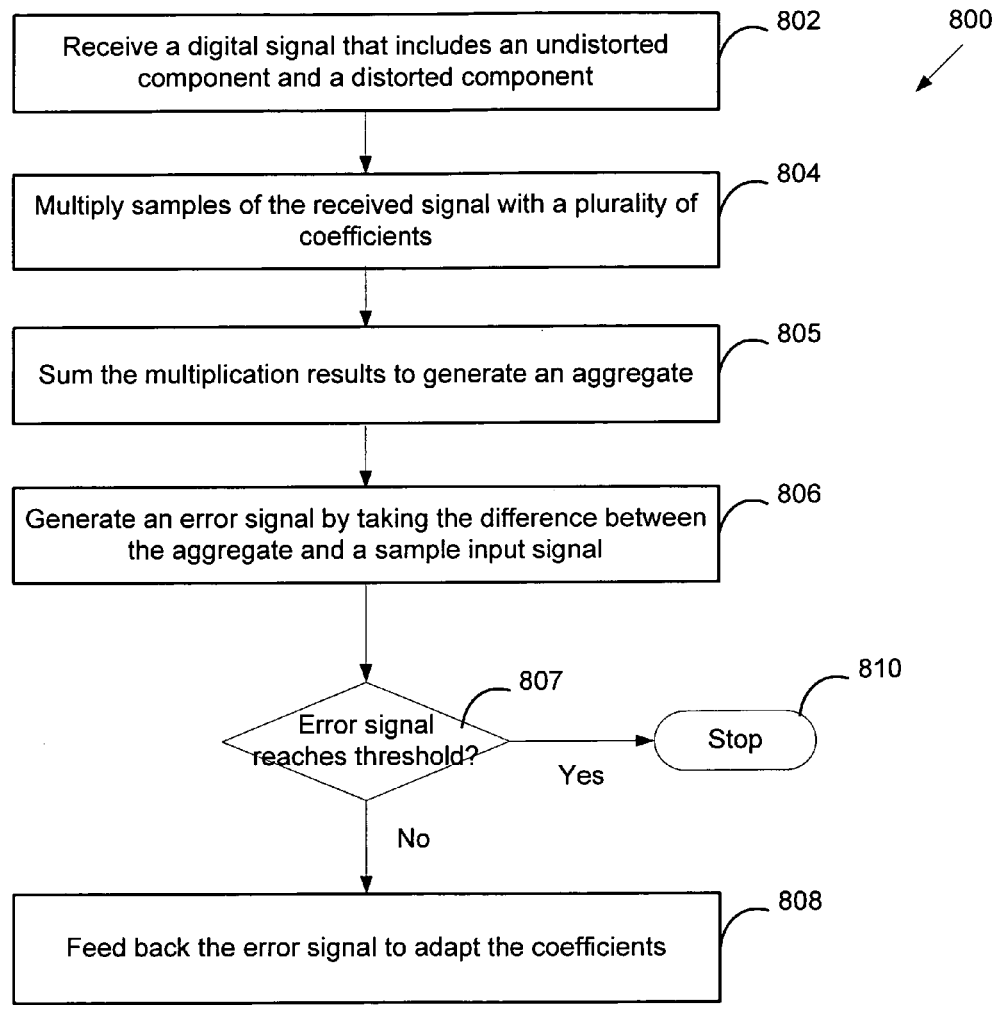
FIG. 8 is a flowchart illustrating an embodiment of a process for extracting an undistorted component from a distorted signal.

FIG. 8 is a flowchart illustrating an embodiment of a process for extracting an undistorted component from a distorted signal. Process 800 may be implemented on a separation block, such as 700 shown in FIG. 7. In this example, during the process, a digital signal that includes an undistorted component and a distorted component is received (802). A plurality of samples of the received signal is multiplied with a plurality of coefficients (804). The multiplication results are summed to produce an aggregate (805). The aggregate enhances the undistorted component and attenuates the distorted component. An error is generated by taking the difference between the aggregate and a sample of the received signal (806). The error signal is compared to a threshold level (807). If the threshold level is reached, the filter has converged and the process stops (810). Else, the error is fed back to adapt the coefficients (808) and the process is repeated for a new set of input samples. The process may be repeated until the filter converges and the error reaches some predetermined level.

The persistence filter can be described using the following functions:

$$\epsilon_n = y_n - V_n Y_n \quad (11)$$

$$\epsilon_n = y_n - \hat{y}_n \quad (12)$$

$$V_{n+1} = v V_n + \mu \epsilon_n Y_n \quad (13)$$

where $Y_n = [y_{n+K}\ y_{n+K-1}\ \cdots\ y_n\ \cdots\ y_{n-K-1}\ y_{n-K}]$, $\mu$ is the adaptation step size that controls the persistency factor of the filter and $v$ is the forgetting factor that controls the speed with which the filter adapts to changing signal dynamics.

Figure 9:
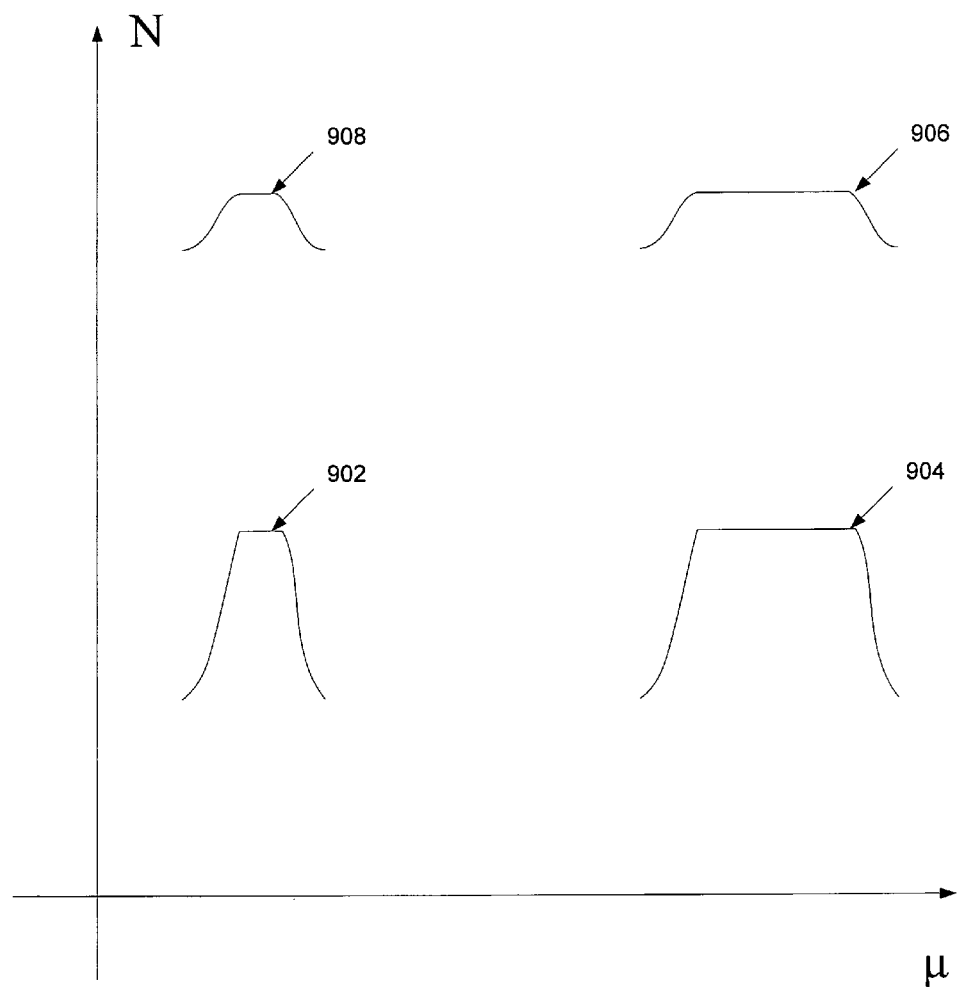
FIG. 9 is a diagram illustrating the relative relationship of step size $\mu$, number of taps N, and the type of linear component that can be effectively extracted.

The number of filter taps N (also referred to as the order of the filter) and the adaptive step size $\mu$ control the persistence filter's operations. A given filter order and step size combination may be particularly effective for emphasizing the received signal's linear component within a certain range of bandwidth and amplitude. FIG. 9 is a diagram illustrating the relative relationship of step size $\mu$, number of taps N, and the type of linear component that can be effectively extracted. The diagram informs the choice of $\mu$ and N. Generally, a higher N (i.e., a greater number of filter taps) should be used as the amplitude of the linear component goes down, and a smaller $\mu$ (i.e., a smaller step size) should be used as the bandwidth of the linear component goes down. As shown in the diagram, if the linear component has a relatively large amplitude and a relatively narrow bandwidth (such as signal 902), a persistence filter with a small $\mu$ and a small N produces good results. A linear component having a similarly large amplitude but a wider bandwidth (signal 904) requires a relatively small N and allows a greater $\mu$. A small amplitude and large bandwidth linear component (signal 906) requires a large N and a large $\mu$. A small amplitude and narrow bandwidth linear component (signal 908) requires a small $\mu$ and a large N. During operation, N and $\mu$ can be adjusted to more effectively generate the emphasized linear component. For example, in some embodiments, a peak detector and a power level detector are used to detect the strength of the signal. The signal strength is a function of the signal's peak and bandwidth. Based on the detected signal strength, appropriate adjustments to N and $\mu$ are made according to system requirements to control the adaptation.

Figure 4B:
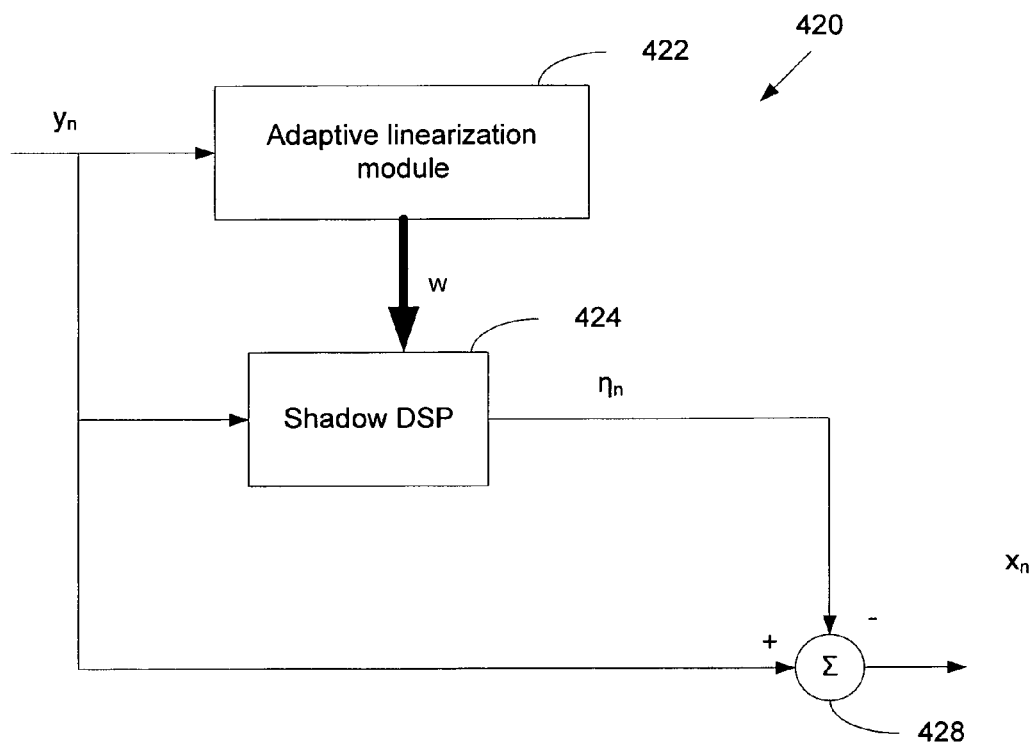
FIG. 4B is a diagram illustrating an embodiment of a low latency adaptive self-linearization system.

In some embodiments, the linearization process requires a large number of samples. The delay k sometimes corresponds to hundreds or even thousands of samples, resulting in delay on the order of tens or even hundreds of milliseconds. Some applications (e.g. telecommunication applications) may require the linearization process to have a lower latency. FIG. 4B is a diagram illustrating an embodiment of a low latency adaptive self-linearization system. In the example shown, system 420 is configured to have much lower latency than system 400. The DSPs shown in the system may be implemented as general or special purpose processors, or configurable filters. Adaptive linearization module 422 configures an internal DSP to simulate the nonlinear transfer function to be corrected and produces an output that is approximately equal to the nonlinear residual signal. As discussed above, assuming that the distortion within the fundamental frequency band is relatively small, a successfully adapted and configured DSP will have a transfer function that is approximately equal to the nonlinear transfer function to be corrected. The linearization module outputs the configuration parameters, w, to a shadow nonlinear DSP 424, which uses the parameters to configure its filters and duplicate the transfer function of the DSP employed by the adaptive linearization module. DSP 424's latency L is on the order of a few milliseconds, which is significantly smaller than the delay due to adaptation k. As such, system 420 has significantly less delay than system 400.

Figure 5B:
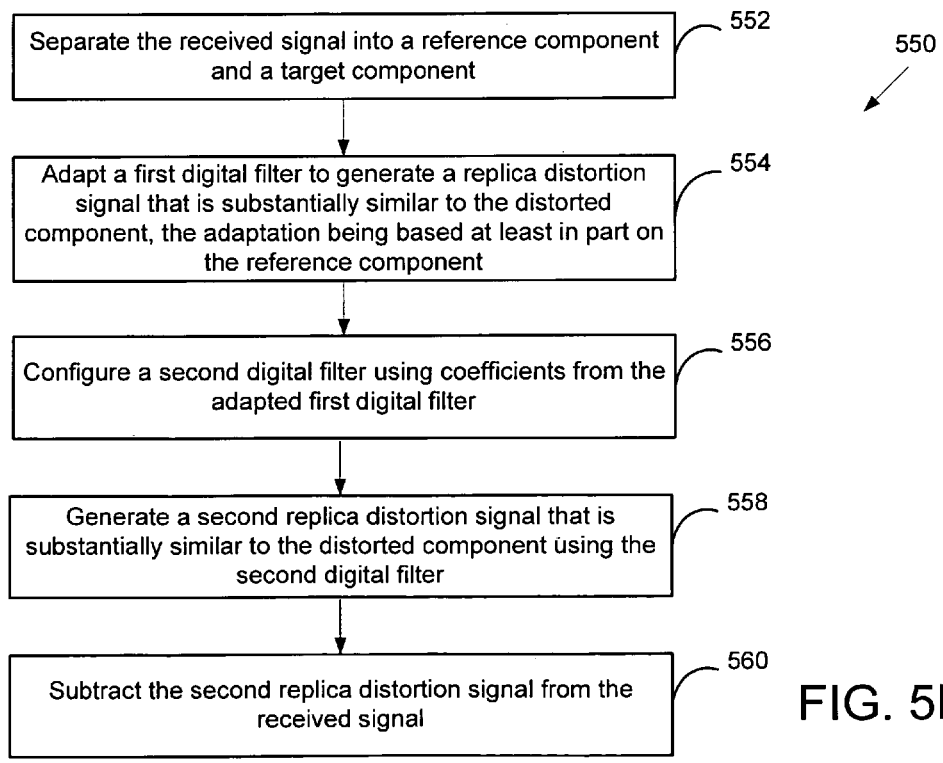
FIG. 5B is a flowchart illustrating another embodiment of an adaptive self-linearization process.

FIG. 5B is a flowchart illustrating another embodiment of an adaptive self-linearization process. Process 550 shown in the example may be implemented on a low latency adaptive self-linearization module such as 420. During the process, an unknown distorted signal is separated into a reference signal and a target signal (552). A first digital filter is adapted to generate a replica distortion signal that is substantially similar to the distorted component, where the adaptation is based at least in part on the reference signal (554). A second digital filter is configured using coefficients from the adapted first digital filter (556). A second replica distortion signal that is substantially similar to the distorted component using the second digital filter (558).

Figure 10A:
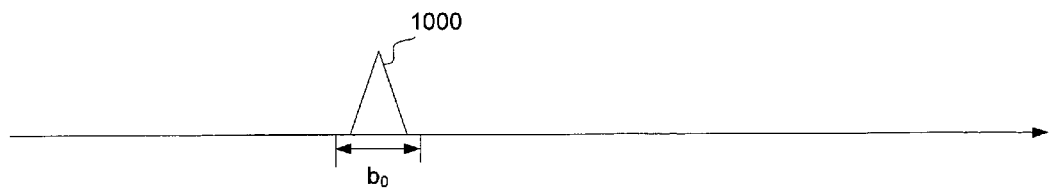
FIGS. 10A-10C are frequency domain signal diagrams illustrating an example of a signal whose reference and target components occupy different frequency bands.
Figure 10B:
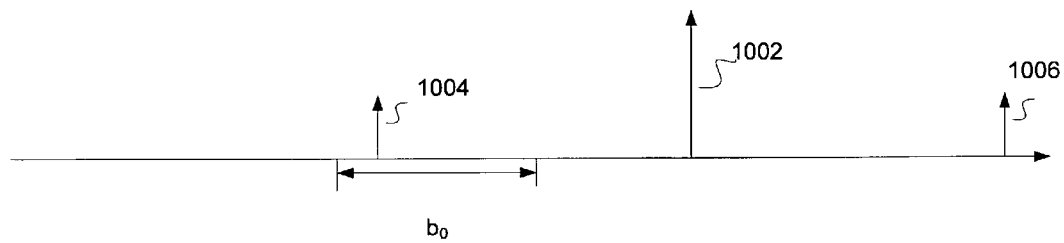
Figure 10C:
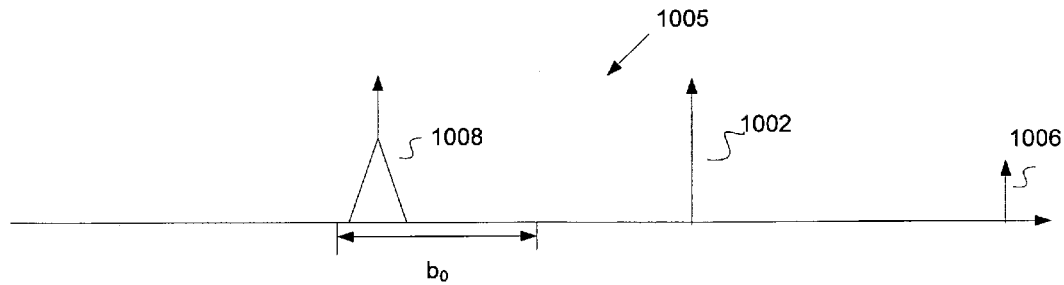

In some embodiments, the reference component and the target component occupy separate frequency bands. FIGS. 10A-10C are frequency domain signal diagrams illustrating an example of a signal whose reference and target components occupy different frequency bands. FIG. 10A shows the ideal, undistorted component 1000, which is limited to frequency band $b_0$. An example of the ideal signal is a radio frequency (RF) signal used in a wireless communication system that employs some form of frequency division, where the signal occupies a specific frequency channel $b_0$. FIG. 10B shows the distortion component, which includes noise signal component 1002 that is outside $b_0$, as well as harmonics of the noise component, including 1004 which falls within frequency channel $b_0$, and 1006 which lies outside $b_0$. An example of noise signal 1002 is another RF signal occupying an adjacent frequency channel relative to signal 1000 and causing distortion in frequency channel $b_0$. FIG. 10C shows the resulting signal 1005. Although the general frequency ranges of the reference and target components are known, the specific characteristics of the signal components are still unknown. Thus, the signal is suitable for processing by any adaptive self-linearization module that implements processes 200 or 500.

Figure 11:
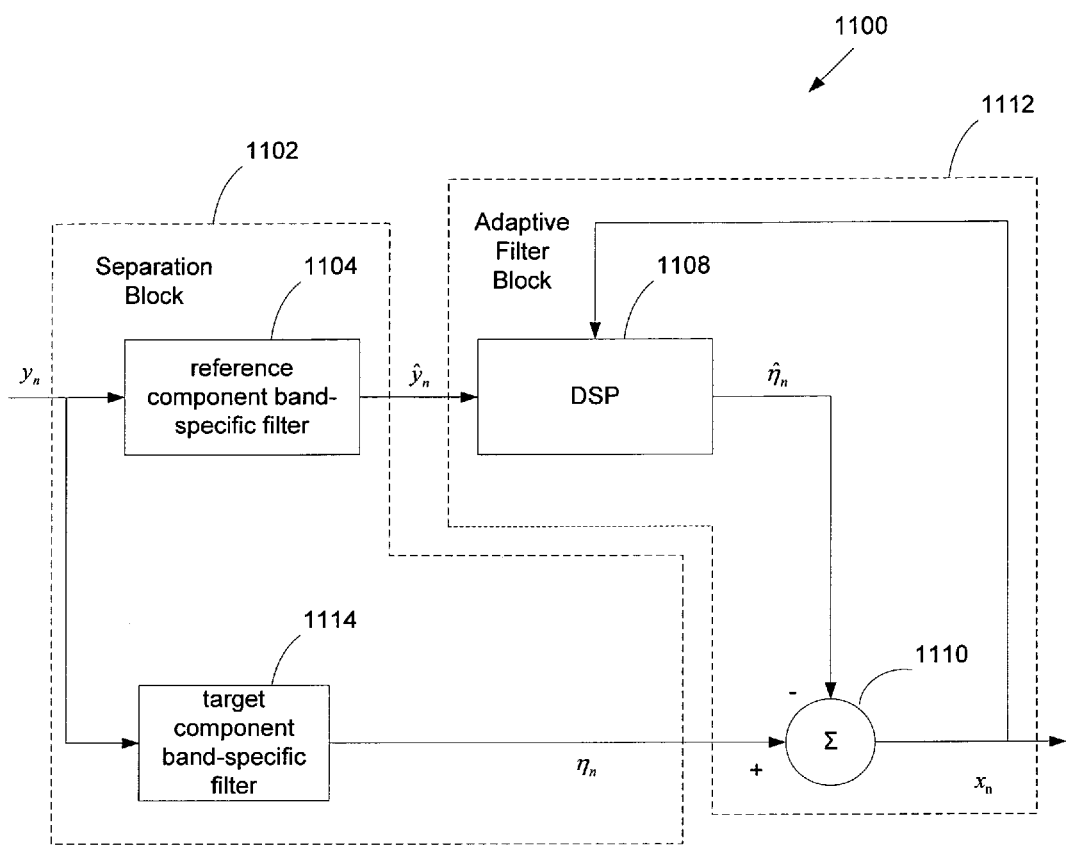
FIG. 11 is a block diagram illustrating another embodiment of an adaptive self-linearization module.

An adaptive self-linearization module such as 400 or 420 described above can be used to process the type of signal shown in FIG. 10C. Assuming that the desired signal causes little distortion in its own frequency band and that most of the distortion in the received signal is caused by noise from neighboring frequency channel(s), it is possible to employ adaptive self-linearization modules with less complex circuitry by taking advantage of the fact that the reference and target components reside in different frequency bands. FIG. 11 is a block diagram illustrating another embodiment of an adaptive self-linearization module. In the example shown, separation block 1102 includes a reference signal band-specific filter 1104 and a target signal band-specific filter 1114. In some embodiments, the reference band-specific filter includes a band-stop filter configured to extract from the received signal the noise component and its harmonics outside frequency band $b_0$ and suppress the components within $b_0$, generating the reference component $\hat{y}_n$. The target signal band-specific filter includes a band-pass filter configured to pass components in frequency band $b_0$ and attenuate the rest of the frequencies, generating the target component $\eta_n$.

Based on reference component $\hat{y}_n$, DSP adapts its parameters to generate a replica of the distorted signal, $\hat{\eta}_n$. The adaptation is possible because the reference component and the distorted signal are correlated. $\hat{\eta}_n$ is subtracted from the target component $\eta_n$ to obtain the desired signal $x_n$. A suitable adaptation technique such as LMS or RLS is used to adapt the DSP. Some embodiments base the adaptation on equations (1)-(10).

Referring to FIGS. 10A-10C as an example, the input signal $y_n$ corresponds to signal 1006. The separation block extracts reference component $y_n$ which corresponds to components 1002 plus 1006 and target component $\eta_n$ which corresponds to component 1008. In some embodiments, the separation block further limits the bandwidth of reference component extraction such that only 1002 is extracted. Based on $\hat{y}_n$ and its feedback signal $x_n$, the adaptive DSP adapts its transfer function to generate $\hat{\eta}_n$, which approximately corresponds to signal 1004

Figure 12A:
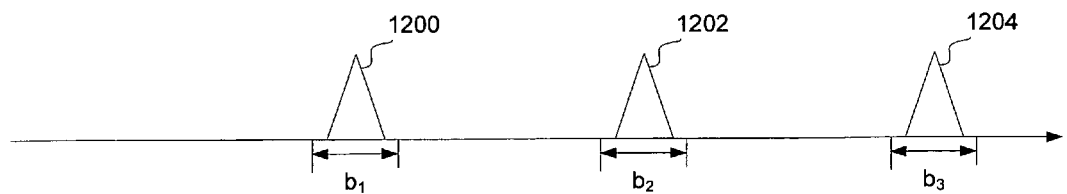
FIGS. 12A-12C are frequency domain signal diagrams illustrating an example where both the reference component and the target component occupy multiple frequency bands.
Figure 12B:
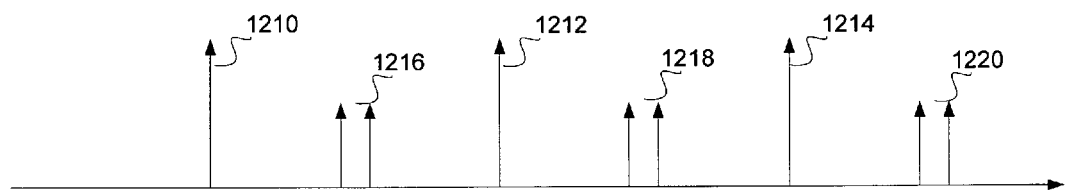
Figure 12C:
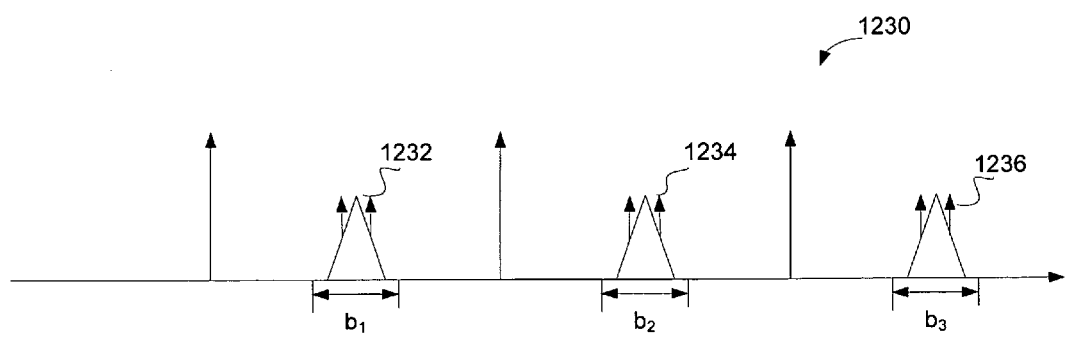

In some embodiments, the offending signals causing distortion in the fundamental frequency band of the desired signal may reside in multiple frequency bands. FIGS. 12A-12C are frequency domain signal diagrams illustrating an example where both the reference component and the target component occupy multiple frequency bands. FIG. 12A shows the undistorted signal components 1200-1204, which occupy separate frequency bands $b_1$-$b_3$. FIG. 12B shows the distorted signal components, which includes several noise components 1210-1214 which reside outside $b_1$-$b_3$, and their harmonics 1216, 1218, and 1220 which reside within $b_1$, $b_2$, and $b_3$ respectively. FIG. 12C shows the resulting distorted signal 1230.

Figure 13:
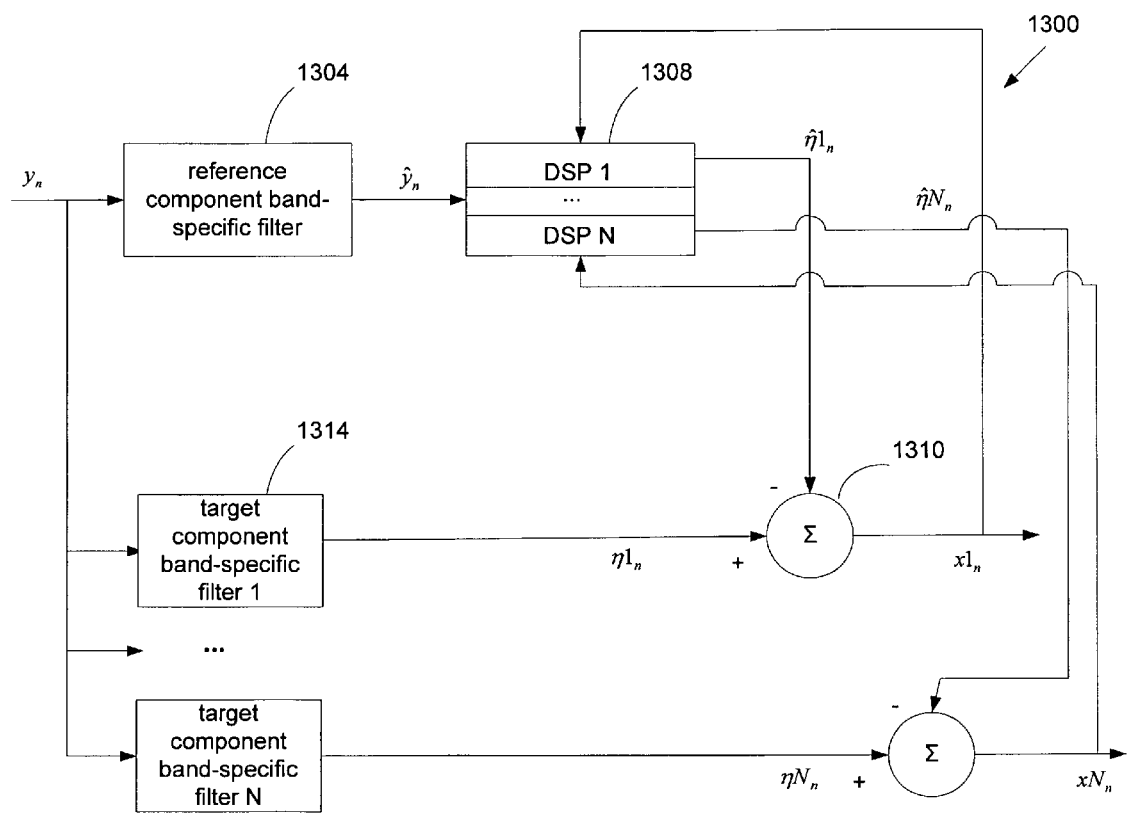
FIG. 13 is a block diagram illustrating an embodiment of an adaptive self-linearization system configured to correct a distorted signal (such as 1230 of FIG. 12C) whose reference components and target components occupy multiple separate frequency bands.

FIG. 13 is a block diagram illustrating an embodiment of an adaptive self-linearization system configured to correct a distorted signal (such as 1230 of FIG. 12C) whose reference components and target components occupy multiple separate frequency bands. In the example shown, system 1300 includes a reference component band-specific filter 1304 for selecting reference signal components $y_n$ that cause distortion (e.g., signal components 1210-1214 shown in FIG. 12B). Filter 1304 may be implemented using a plurality of bandpass filters. The system also includes N target component band-specific filters for producing target components $\eta k_n$ ($k=-1, \ldots, N$) in specific frequency bands. In the example shown in FIG. 12C, N=3, and target components corresponding to 1232, 1234 and 1236 are produced. N DSPs are each adapted based on the reference component and a corresponding feedback signal $xk_n$ to generate distortion components $\hat{\eta}k_n$ ($k=1, \ldots, N$). Each $\eta k_n$ is subtracted from the target component $\eta_n$ to obtain the desired signal $x_n$. The adaptation technique of each DSP is similar to what was described in FIG. 11.

Averaging Persistence Filter

The persistence filter implementation shown in 702 of in FIG. 7 above has many coefficients and multipliers. During each time cycle, 1024 multiplications are carried out to obtain a new output in filter 702. The size and power dissipation required for such a large filter can be expensive. One way to reduce the number of multiplications is to simply compute an output every R time cycles (R>1) rather than every time cycle, which can reduce the number of multipliers and adders by a factor of R. For example, if an output is computed every 8 samples, the number of multipliers/coefficients can be reduced from 1024 to 128. The tradeoff of such an implementation is that the amount of time it takes for the filter to reach convergence (i.e., for the adaptation error to stabilize and reach a certain limit) is increased by a factor of R. The speed of convergence for a persistence filter such as 702 that produces one output for every input sample is said to be proportional to the input data rate. Accordingly, the speed of convergence for a slower but otherwise unimproved persistence filter that produces one input for every R input samples is proportional to 1/R the input data rate.

A technique for implementing a persistence filter with reduced complexity and low power consumption, without compromising convergence time is described below. The technique generates an output for every R time cycles. A reduction in the number of multipliers by a factor of R is achieved. For purposes of example, the following discussion illustrates the technique for R=4. The technique is also applicable for other reduction factor values.

A persistence filter can be described using equations (11)-(13). The filter adapts its coefficients and drives its output to be close to the target input signal, until the error (i.e., the difference between the output and the target) meets some predetermined threshold. Based on the equations, a set of 4 linearly enhanced components at time cycles n, n+1, n+2, and n+3 are computed as follows:

$$\hat{y}_n = [y_n y_{n-1} \ldots y_{n-N}] V_n \quad (14)$$

$$\hat{y}_{n+1} = [y_{n+1} y_n \ldots y_{n-N+1}] V_{n+1} \quad (15)$$

$$\hat{y}_{n+2} = [y_{n+2} y_{n+1} \ldots y_{n-N+2}] V_{n+2} \quad (16)$$

$$\hat{y}_{n+3} = [y_{n+3} y_{n+2} \ldots y_{n-N+3}] V_{n+3} \quad (17)$$

Each linearly enhanced component $\hat{y}_i$ is equivalent to an aggregate of a set of samples that is taken at time cycle i and that is scaled by the coefficients. At each sample time cycle, an update error $\epsilon$ is generated:

$$\epsilon_n = y_n - \hat{y}_n \quad (18)$$

$$\epsilon_{n+1} = y_{n+1} - \hat{y}_{n+1} \quad (19)$$

$$\epsilon_{n+2} = y_{n+2} - \hat{y}_{n+2} \quad (20)$$

$$\epsilon_{n+3} = y_{n+3} - \hat{y}_{n+3} \quad (21)$$

For the sake of simplicity, assume that v=1. Based equation (13), the following coefficient updates are obtained:

$$V_{n+1} = V_n + \mu \epsilon_n Y_n \quad (22)$$

$$V_{n+2} = V_{n+1} + \mu \epsilon_{n+1} Y_{n+1} \quad (23)$$

$$V_{n+3} = V_{n+2} + \mu \epsilon_{n+2} Y_{n+2} \quad (24)$$

$$V_{n+4} = V_{n+3} + \mu \epsilon_{n+3} Y_{n+3} \quad (25)$$

Thus, $$V_{n+4} = V_n + \mu(\epsilon_n Y_n + \epsilon_{n+1} Y_{n+1} + \epsilon_{n+2} + Y_{n+2} \epsilon_{n+3} Y_{n+3}) \quad (26)$$

Alternatively, the error of the persistence filter can be estimated at a lower rate but with greater accuracy by computing an error for every 4 sample time cycles rather than an error for every sample time cycle. Such a filter, referred to as an averaging persistence filter, can be modeled as follows:

$$\begin{aligned}\hat{\omega}_{n+3} &= \hat{y}_n + \hat{y}_{n+1} + \hat{y}_{n+2} + \hat{y}_{n+3} \quad (27)\\ &= [(y_n + y_{n+1} + y_{n+2} + y_{n+3})(y_{n-1} + y_n + y_{n+1} + y_{n+2}) \ldots \\ & \quad (y_{n-N} + y_{n-N+1} + y_{n-N+2} + y_{n-N+3})]V_n \\ &= [s_{n+3}\ s_{n+2}\ s_{n+1}\ s_n\ \ldots\ s_{n-N+3}]V_n \\ &= \tilde{Y}_{n+3}V_n \end{aligned}$$

where $\hat{\omega}_{n+3}$ is an aggregate of several linearly enhanced signals. In this example, $\hat{\omega}_{n+3}$ is an aggregate of 4 linearly enhanced signals $\hat{y}_n$, $\hat{y}_{n+1}$, $\hat{y}_{n+2}$, and $\hat{y}_{n+3}$. Each linearly enhanced signal can be viewed as an aggregate of a set of samples that is scaled by the set of coefficients (in other words, the linearly enhanced signal is the scalar product of an input samples vector (e.g., $[y_n\ y_{n-1}\ y_{n-2}\ \ldots\ y_{n-N}]$) and a coefficient vector). The same set of coefficients $V_n$ is used to scale 4 sets of input samples from different sample times. Further, $$\omega_{n+3} = y_n + y_{n+1} + y_{n+2} + y_{n+3} \quad (28)$$

where $\omega_{n+3}$ is a sum of the desired target input signal over 4 consecutive samples.

An average error value is generated for every 4 input samples by taking the difference between the sum of the aggregated signals and the sum of the input signal samples:

$$\hat{e}_{n+3} = w_{n+3} - \hat{w}_{n+3} \quad (29)$$

Accordingly, the filter coefficient vector is also updated every 4 samples:

$$V_{n+4} = V_n + \mu(\hat{e}_{n+3}\tilde{Y}_n) \quad (30)$$

An averaging persistence filter that is updated every R samples and generates an output sample for every R input samples is simpler to implement than a standard persistence filter such as 702 that is updated every sample since the computing requirements of the former are reduced by a factor of R. Averaging over R samples also makes the error samples less noisy. Even though an error sample is generated every R input samples, averaging allows a larger step size μ to be used. As will be described in greater detail below, by storing extra data and using shared multipliers, the averaging persistence filter achieves power savings without sacrificing convergence speed. Although the averaging persistence filter is updated at 1/R the input data rate and generates one output for every R input samples, the filter still converges at a speed that is proportional to the data rate of the input. In other words, the averaging persistence filter's speed of convergence is the same as a more complicated persistence filter (such as 702) that generates an output for every input sample.

FIGS. 14A-14D are block diagrams illustrating an embodiment of an averaging persistence filter and its operations over four time cycles. In the examples, an averaging persistence filter 752 that implements the filter model described in equations (27)-(30) above is shown. The averaging persistence filter can be used in a separation block such as separation block 700 of FIG. 7 in place of persistence filter 702. The averaging persistence filter in this example generates an output for every 4 input samples in this example, giving a reduction factor R of 4. The inputs and intermediate values during time cycles 1, 2, 3, and 4 are illustrated in FIGS. 14A, 14B, 14C, and 14D, respectively.

Figure 14A:
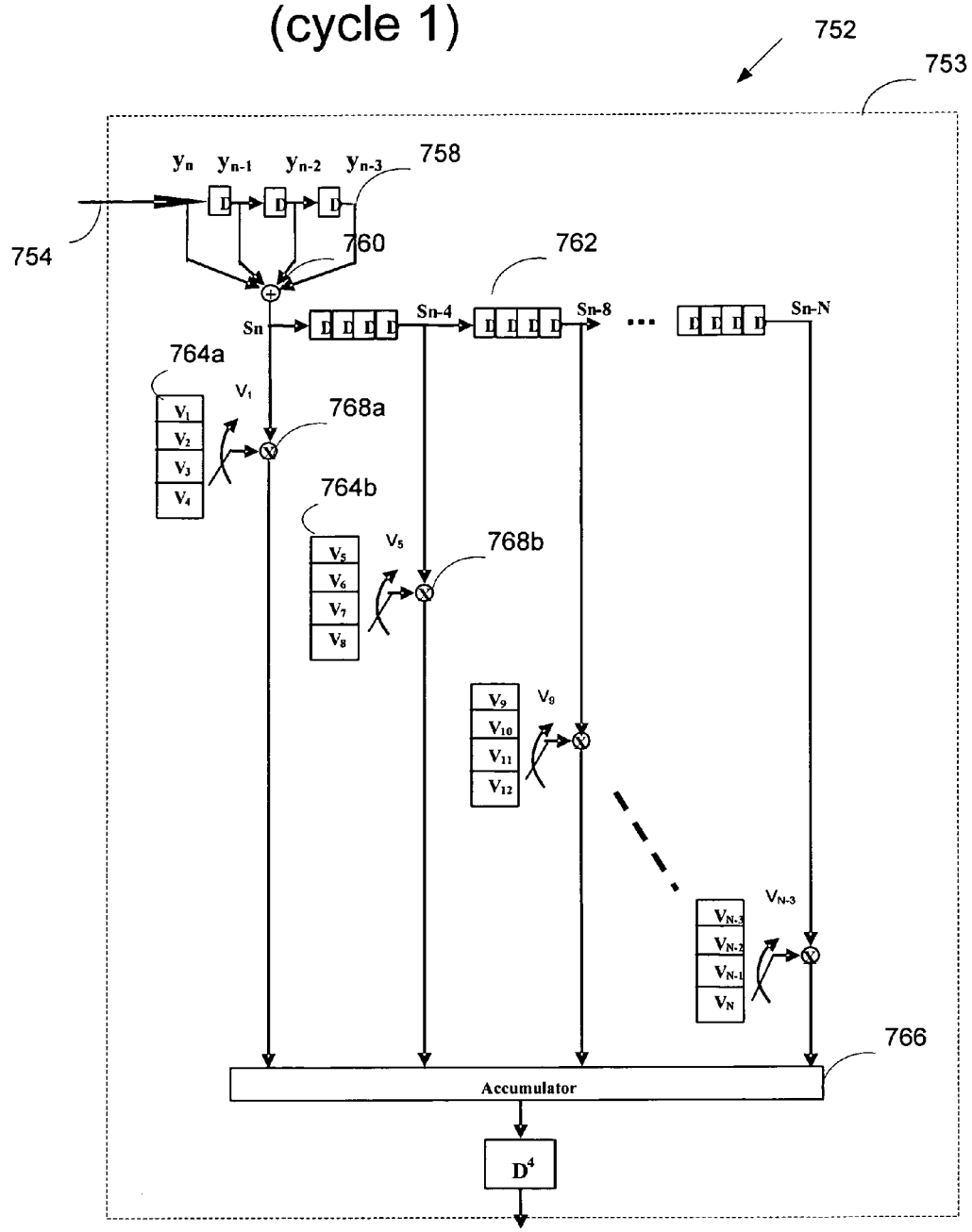
FIGS. 14A-14D are block diagrams illustrating an embodiment of an averaging persistence filter and its operations over four time cycles.

As shown in FIG. 14A, averaging persistence filter 752 includes an input interface 754 configured to receive data samples. A processor 753 is directly or indirectly coupled to the input interface. As will be described in greater detail below, the processor is configured to determining an aggregate of a plurality of linear reference components. Each linear reference component is approximately equal to an aggregate of a corresponding set of digital signal samples that is scaled by the plurality of coefficients.

In this example, the processor includes a delay line 758, which is configured to store 4 consecutive samples of the input signal. A shift register or other appropriate memory elements can be used to implement the delay line. The samples are summed by an adder 760. The sum is stored in another delay line 762, which can be implemented using a shift register or the like. The coefficients $[v_1\ \ldots\ v_{N-1}]$ are stored in memory elements 764a, 764b, etc., which may be parts of the same component or separate components. During each time cycle, selected coefficients are used to multiply with appropriate sums. Multipliers 768a, 768b, etc., are each shared by corresponding groups of 4 coefficients. The results are sent to an accumulator 766 to be aggregated.

FIG. 14A shows time cycle 1. Input samples $y_n$, $y_{n-1}$, $y_{n-2}$, and $y_{n-3}$ are stored in delay line 758. A sum $s_n = y_n + y_{n+1} + y_{n+2} + y_{n+3}$ is generated and store to delay line 762. The delay line also stores sums of the previous input samples up to $s_{n-N}$. $s_n$ and sums that were obtained multiples of 4 time cycles ago (i.e., $s_{n-4}$, $s_{n-8}$, etc.) are multiplied with selected coefficients. The first coefficient of each group of 4 coefficients (i.e., $v_1$ from coefficient group $v_1$-$v_4$, $v_5$ from coefficient group $v_5$-$v_8$, etc.) is selected and multiplied with the appropriate sum. The results are added by accumulator 766 and stored.

Figure 14B:
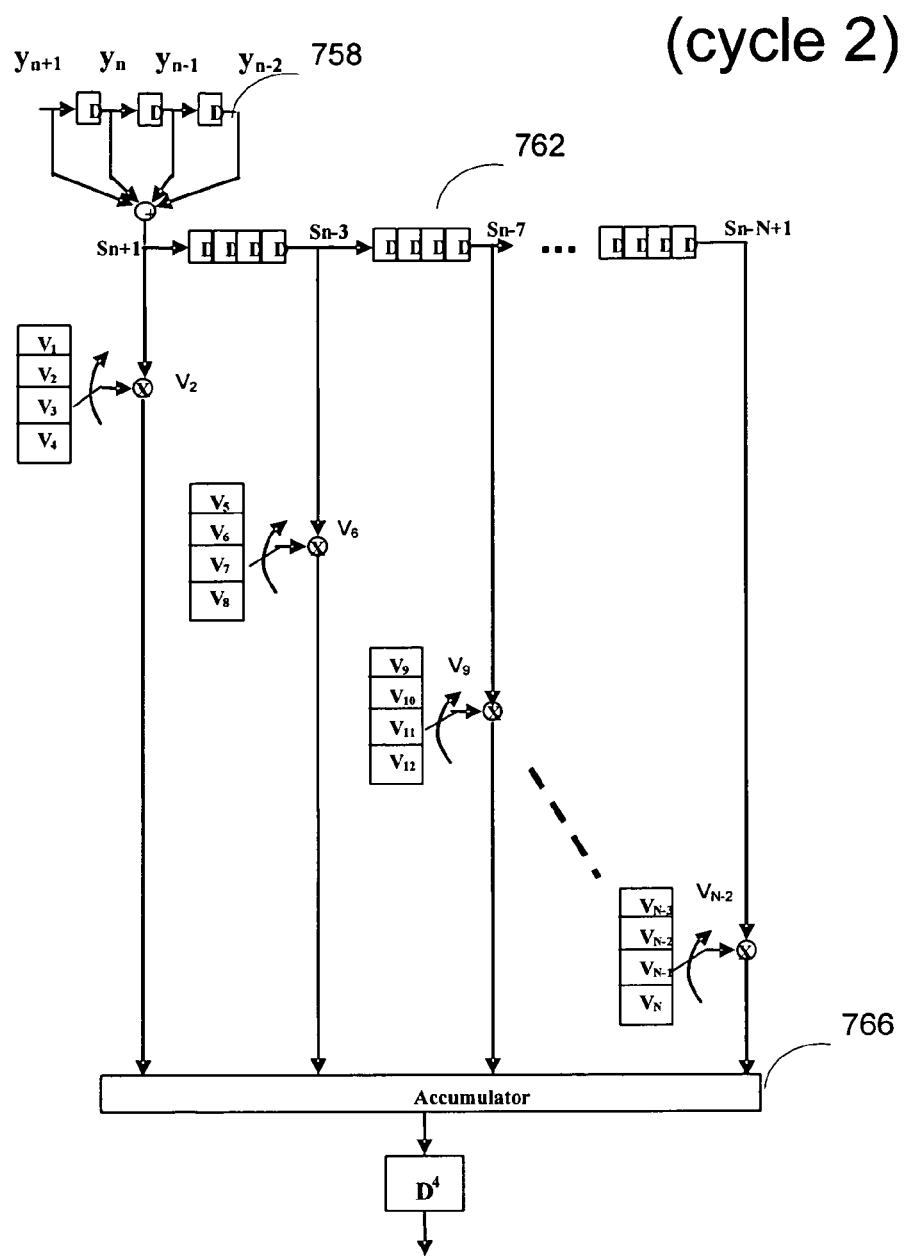

In FIG. 14B, time cycle 2, a new input sample $y_{n+1}$ is received, and the old input samples are shifted such that $y_{n+1}$, $y_n$, $y_{n-1}$, and $y_{n-2}$ are stored in delay line 758. A new sum based on these values, $s_{n+1}$, is computed. The sums in delay line 762 are also shifted. The second coefficients of the coefficient group ($v_2$, $v_6$, $v_{10}$, etc.) are selected and multiplied with sums $s_{n+1}$, $s_{n-3}$, $s_{n-7}$, etc. The results are added to the existing value in accumulator 766.

Figure 14C:
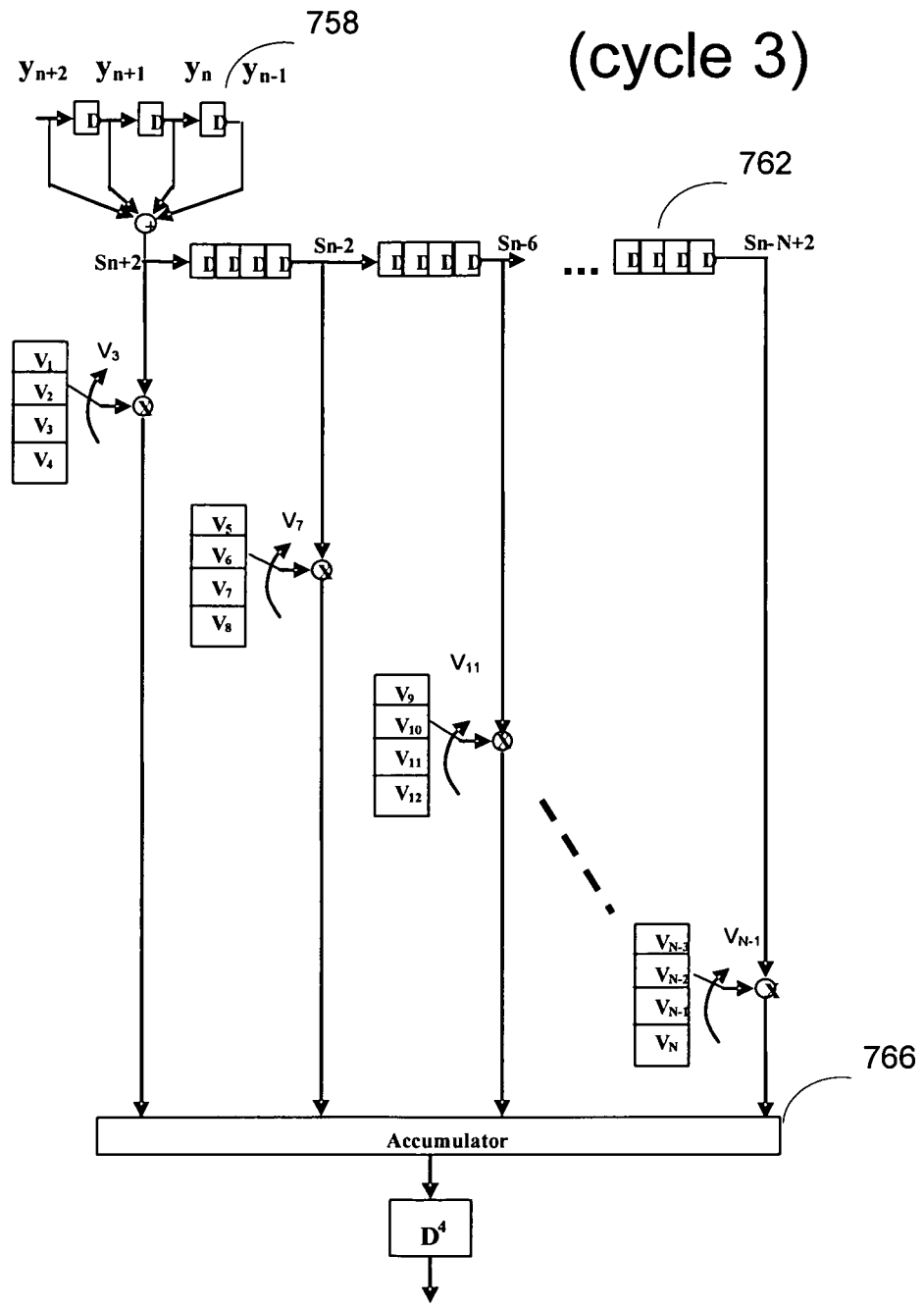

In FIG. 14C, time cycle 3, a new input sample $y_{n+2}$ is received, and the old input samples are shifted such that $y_{n+2}$, $y_{n+1}$, $y_n$, and $y_{n-1}$ are stored in delay line 758. A new sum based on these values, $s_{n+2}$, is computed. The sums in delay line 762 are also shifted. The third coefficients of the coefficient group ($v_3$, $v_7$, $v_{11}$, etc.) are selected and multiplied with sums $s_{n+2}$, $s_{n-2}$, $s_{n-6}$, etc. The results are added to the existing value in accumulator 766.

Figure 14D:
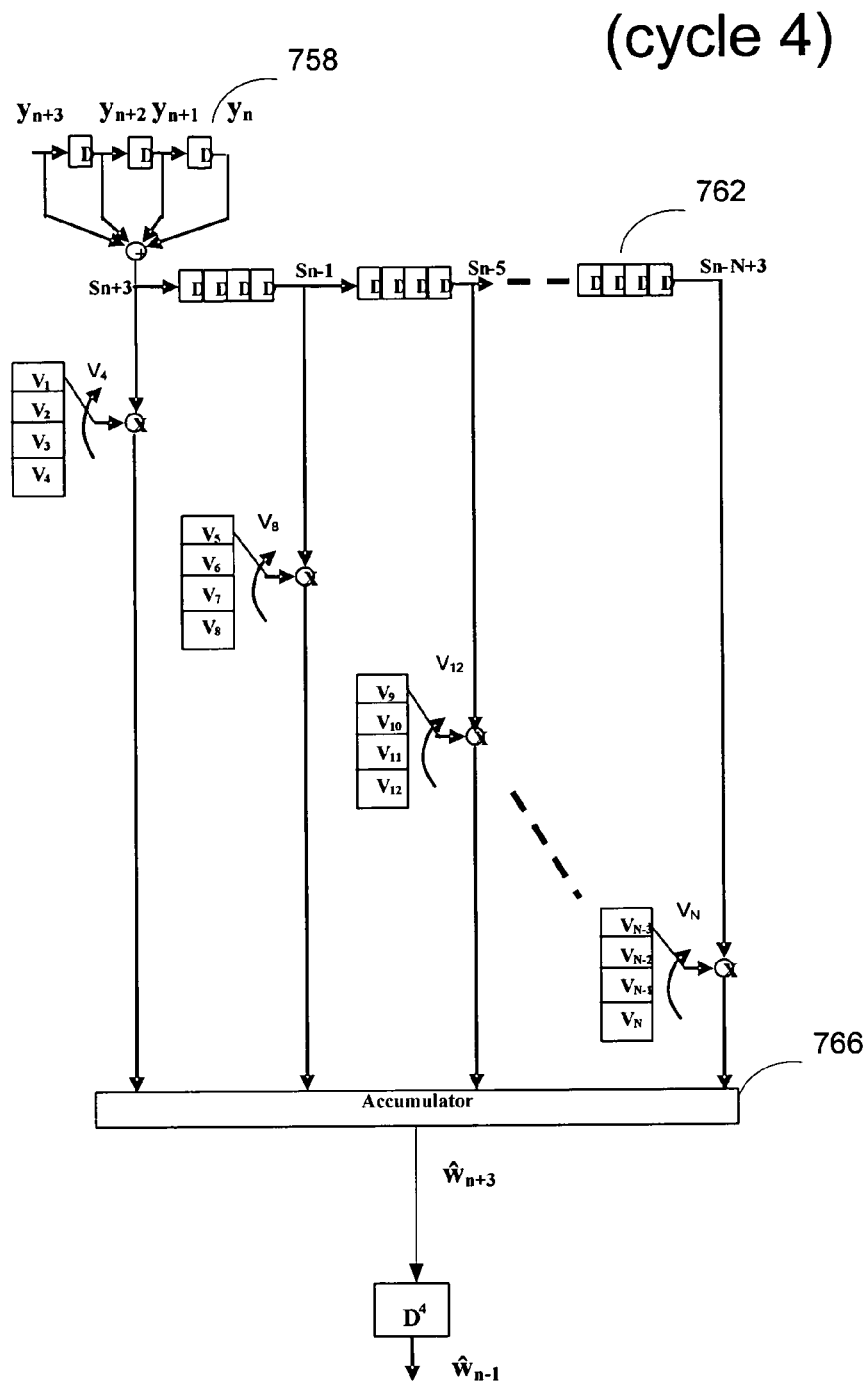

In FIG. 14D, time cycle 4, a new input sample $y_{n+3}$ is received, and the old input samples are shifted such that $y_{n+3}$, $y_{n+2}$, $y_{n+1}$, and $y_n$ are stored in delay line 758. A new sum based on these values, $s_{n+3}$, is computed. The sums in delay line 762 are also shifted. The fourth coefficients of the coefficient group ($v_4$, $v_8$, $v_{12}$, etc.) are selected and multiplied with sums $s_{n+3}$, $S_{n-1}$, $S_{n-5}$, etc. The results are added to the existing value in accumulator 766. At this point, the accumulator value that has been accumulating over 4 time cycles is equivalent to $\hat{\omega}_{n+3}$. The value is sent to the output, and accumulator 766 is cleared. The cycles repeat and another output sample is generated 4 cycles later. An output delay line is optionally included to store more than one output samples.

Figure 15:
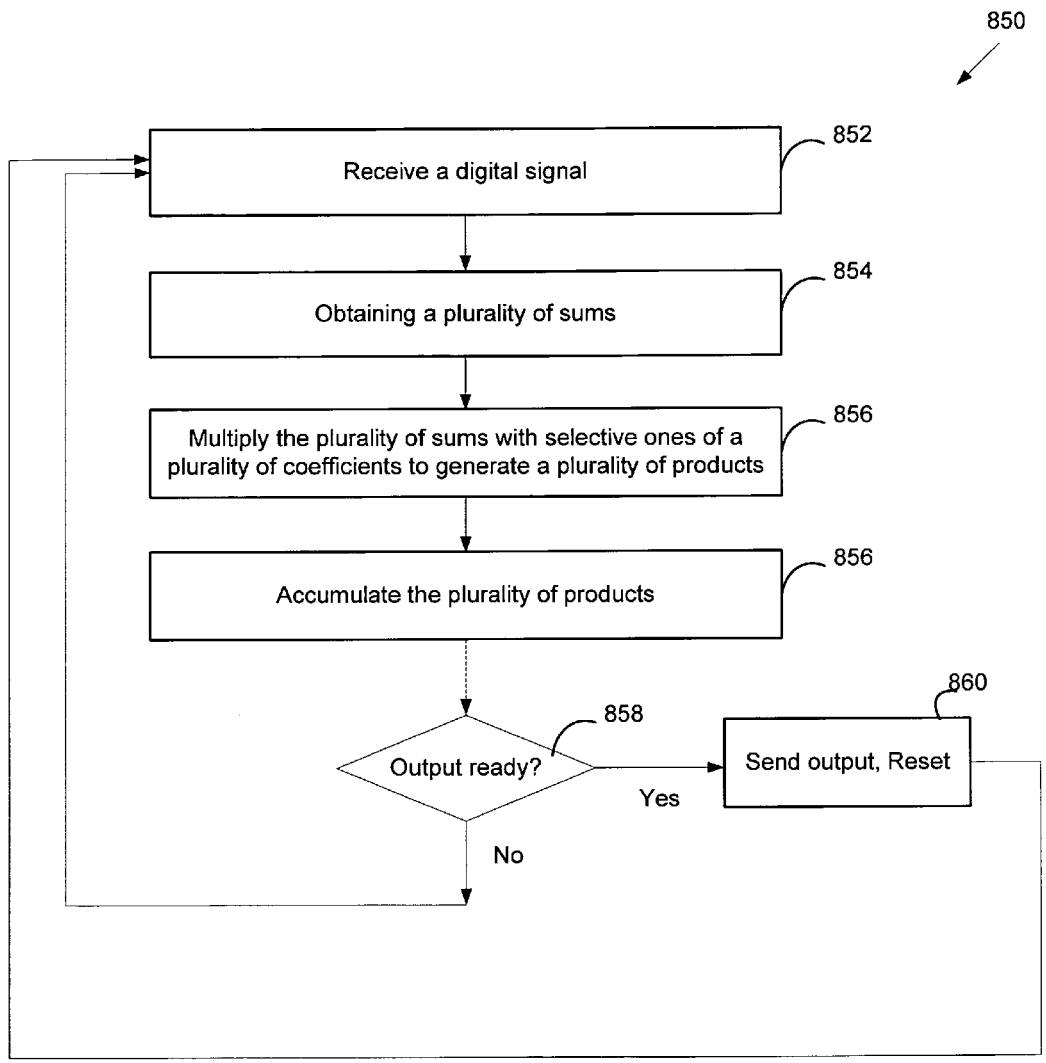
FIG. 15 is a flowchart illustrating another embodiment of a signal processing process.

FIG. 15 is a flowchart illustrating another embodiment of a signal processing process. Process 850 may be implemented on an averaging persistence filter such as 752 of FIGS. 14A-14D. The process initiates when a digital signal is received (852). In example filter 752, the samples of the digital signal are received and fill up the delay lines. A plurality of sums is obtained (854). As described above in FIGS. 14A-14D, the sums are obtained by adding a new set of consecutive samples, or by taking a previously calculated sum from a memory location in the delay line. Selective ones of a plurality of coefficients are multiplied with the sums to generate a plurality of products (856). At least some of the multiplications are done using a shared multiplier. The products are accumulated (856). It is determined whether the accumulated value is ready to be output (858). The value is ready to be output when the process has been repeated R times since the beginning of the process or since the last reset. If the process has not been repeated R times since the beginning or since the last reset, it is repeated. More sums and more products are obtained, and the products continue to accumulate. If, however, the process has been repeated R times, the accumulated result is sent to the output, and the value in the accumulator resets to 0 (860). The process can be repeated from the beginning again.

Figure 16:
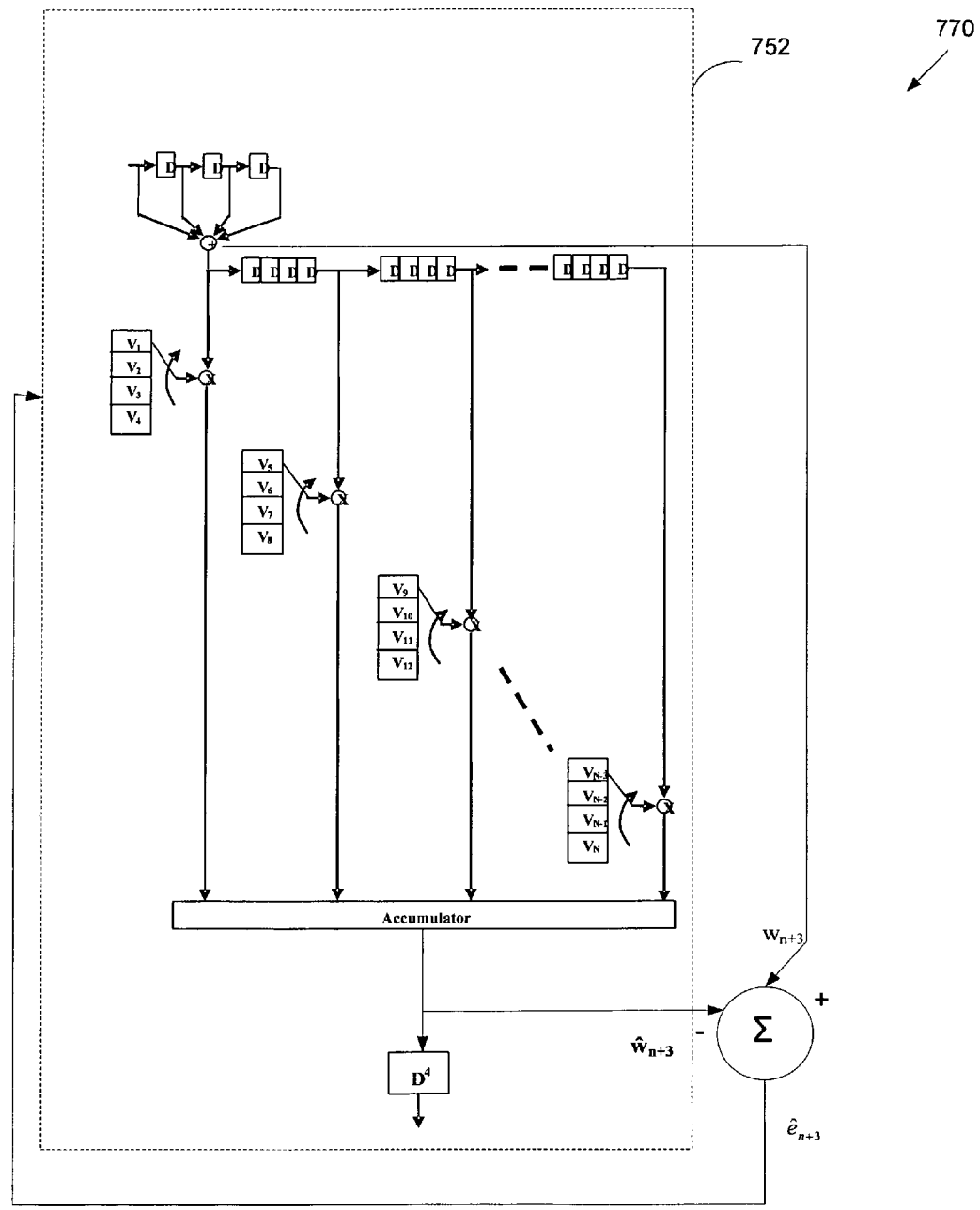
FIG. 16 is a block diagram illustrating an embodiment of a separation block that includes an embodiment of an averaging persistence filter.

In some embodiments, the averaging persistence filter is used to implement a separation block such as separation block 602 of FIG. 6. FIG. 16 is a block diagram illustrating an embodiment of a separation block that includes an embodiment of an averaging persistence filter. In this example, separation block 770 includes an averaging persistence filter 752 that is the same as filter 752 shown previously. The output of the averaging persistence filter is subtracted from a sum of 4 consecutive samples $w_{n+3}$ to generate an average error $\hat{e}_{n+3}$. The error is fed back to filter 752 to adapt the filter coefficients according to equation (30). The separation block may be included in an adaptive self-linearization module such as 402 or 422 of FIG. 4A or 4B, respectively. In a system such as 420 which employs a shadow DSP for reduced latency, the adaptive linearization module implemented using an averaging persistence filter is configured to run at a lower update rate. Once the DSP in the adaptive filter block converges and feeds its updated coefficients to shadow DSP 424, however, the shadow DSP can operate at full data rate, i.e., an output of the shadow DSP is generated for every input sample.

Figure 17:
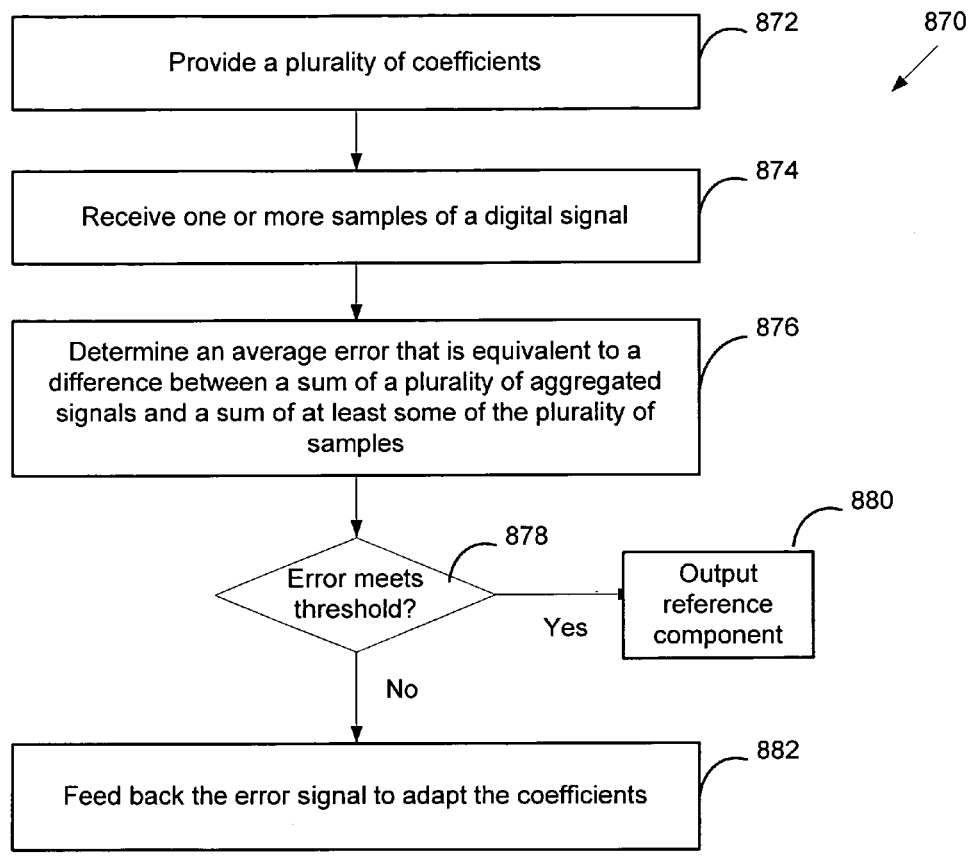
FIG. 17 is a flowchart illustrating another embodiment of a signal processing process.

FIG. 17 is a flowchart an embodiment of a signal processing process. Process 870 may be implemented on a separation block that includes an averaging persistence filter, such as separation block 770 of FIG. 16. Process 870 begins with providing a plurality of coefficients V (872). A digital signal that includes an undistorted component and a distorted component are received (874). An average error is determined (876). As described above, the average error $\hat{e}_{n+3}$ is equivalent to the difference between an aggregate of several linearly enhanced components obtained during R time cycles and a sum of several input samples that received during the R time cycles. In some embodiments, to obtain an aggregate of the reference components, subsets of consecutive input samples are grouped, and sums of the subsets are computed and used to multiply with the coefficients. It is determined whether the average error meets some predefined threshold (878). If so, the filter has converged and the process can stop. The output of the averaging persistence filter is sent to the output of the separation block as the reference component. If, however, the average error does not meet the predefined threshold, the error signal is fed back to adapt the coefficients and reduce error. The process is repeated until the error meets the threshold and the filter converges.

Adaptive self-linearization of a distorted signal using an averaging persistence filter has been described. The techniques described are generally applicable to nonlinear systems. The methods described may be implemented using filters, DSPs, as well as implemented as computer code that operates on general purpose processors.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system comprising:
an averaging persistence filter configured to capture a persistent portion of a digital signal and to remove a non-persistent portion of the digital signal, the averaging persistence filter comprising:
an interface configured to receive the digital signal; and
one or more processors, coupled to the interface, configured to:
aggregate a plurality of digital signal sample sets of the digital signal to generate aggregated results;
scale the aggregated results using selective ones of a plurality of coefficients to generate a plurality of linear reference components of the digital signal;
aggregate the plurality of linear reference components; and
determine an output based on the aggregated plurality of linear reference components.

2. The system of claim 1, wherein the one or more processors include a shared multiplier that is shared by at least some of the plurality of coefficients.

3. The system of claim 1, wherein the one or more processors are further configured to determine a sum of R digital signal samples during a time cycle.

4. The system of claim 3, wherein the sum is multiplied with a selected one of the plurality of coefficients.

5. The system of claim 1, wherein the one or more processors include a shared multiplier, and wherein the one or more processors are further configured to:
determine a first sum of R digital signal samples during a first time cycle;
multiply the first sum with a selected first one of the plurality of coefficients using the shared multiplier to obtain a first product;

determine a second sum of R digital signal samples during a second time cycle; and multiply the second sum with a selected second one of the plurality of coefficients using the shared multiplier to obtain a second product.

6. The system of claim 5, wherein the one or more processor further comprise: an accumulator, and wherein the one or more processors are further configured to aggregate the first product and the second product using the accumulator.

7. The system of claim 1, wherein the digital signal has an input data rate, and wherein the output has an output data rate that is 1/R of the input data rate, R being an integer that is greater than one.

8. The system of claim 7, wherein the system has a speed of convergence that is proportional to the input data rate.

9. A signal processing method, comprising:
   inputting a digital signal at an interface of an averaging persistence filter;
   aggregating a plurality of digital signal sample sets of the digital signal to generate aggregated results;
   scaling the aggregated results using selective ones of a plurality of coefficients to generate a plurality of linear reference components of the digital signal;
   aggregating the plurality of linear reference components; and
   determining an output based on the aggregated plurality of linear reference components,
   a persistent portion of the digital signal being included in the output and a non-persistent portion of the digital signal being removed from the output.

10. The method of claim 9, wherein the determining the output comprises: determining a sum of R digital signal samples during a time cycle.

11. The method of claim 10, wherein the determining the output further comprises: multiplying the sum with a selected one of the plurality of coefficients.

12. The method of claim 9, wherein the determining the output comprises:
   determining a first sum of R digital signal samples during a first time cycle;
   multiplying the first sum with a first selected one of the plurality of coefficients using a shared multiplier to obtain a first product;
   determining a second sum of R digital signal samples during a second time cycle; and
   multiplying the second sum with a second selected one of the plurality of coefficients using the shared multiplier to obtain a second product.

13. The method of claim 12, wherein the determining the output further comprises: aggregating the first product and the second product using an accumulator.

14. The method of claim 9, wherein the inputting the digital signal comprises: inputting the digital signal having an input data rate, and wherein the determining the output comprises: determining the output having an output data rate that is 1/R of the input data rate, R being an integer that is greater than one.

15. A non-transitory computer-readable storage medium having instructions stored thereon, execution of which, by a computing device, causes the computing device to perform operations comprising:
   aggregating a plurality of digital signal sample sets of a digital signal to generate aggregated results;
   scaling the aggregated results using selective ones of a plurality of coefficients to generate a plurality of linear reference components of the digital signal;
   aggregating the plurality of linear reference components; and
   determining an output based on the aggregated plurality of linear reference components,
   a persistent portion of the digital signal being included in the output and a nonpersistent portion of the digital signal being removed from the output.

16. A signal processing system comprising:
   an input interface configured to receive a digital signal having a distorted component and an undistorted component; and
   a separation block coupled to the input interface, configured to separate from the digital signal a reference component and a target component,
   the separation block including a filter configured to:
      aggregate a plurality of digital signal sample sets of the digital signal;
      scale aggregated results using selective ones of a plurality of coefficients to generate a plurality of linear reference components of the digital signal;
      aggregate the plurality of linear reference components; and
      determine a filter output based on the aggregated plurality of linear reference components;
      wherein the filter is further configured to capture a persistent portion of the digital signal and to remove a non-persistent portion of the digital signal.

17. The signal processing system of claim 16, wherein the separation block is further configured to determine an error signal that corresponds to a difference between the filter output and a sum of a plurality of consecutive samples of the digital signal.

18. The signal processing system of claim 17, wherein the error signal is fed back to the filter to adapt the plurality of coefficients.

19. The signal processing system of claim 16, wherein the filter comprises: a shared multiplier that is shared by at least some of the plurality of coefficients.

20. The signal processing system of claim 16, wherein the filter is configured to determine a sum of R digital signal samples during a time cycle.

21. The signal processing system of claim 16, further comprising: an adaptive filter, coupled to the separation block, configured to adaptively generate, based on the reference component, a replica distortion signal that is substantially similar to the distorted component.

22. A method of signal processing, comprising:
   receiving, at an interface of an averaging persistence filter, a digital signal having a distorted component and an undistorted component; and
   separating from the digital signal a reference component that corresponds to a persistent portion of the digital signal and a target component that corresponds to a difference of the digital signal and the reference signal, the separating including:
      aggregating a plurality of digital signal sample sets of the digital signal to generate aggregated results;
      scaling the aggregated results using selective ones of a plurality of coefficients to generate a plurality of linearly enhanced components of the digital signal;
      aggregating the plurality of linearly enhanced components; and
      generating the reference component based on the aggregated plurality of linearly enhanced components.

23. The method of claim 22, further comprising: determining an error signal that corresponds to a difference between the filter output and a sum of a plurality of consecutive samples of the digital signal.

24. The method of claim 23, further comprising: feeding back the error signal; and adapting the plurality of coefficients.

25. The method of claim 22, further comprising: determining a sum of R digital signal samples during a time cycle.

26. The method of claim 22, further comprising: adaptively generating, based on the reference component, a replica distortion signal that is substantially similar to the distorted component.

27. A non-transitory computer-readable storage medium having instructions stored thereon, execution of which, by a computing device, causes the computing device to perform operations comprising:

receiving a digital signal having a distorted component and an undistorted component; and separating from the digital signal a reference component that corresponds to a persistent portion of the digital signal and a target component that corresponds to a difference of the digital signal and the reference signal, the separating including:

aggregating a plurality of digital signal sample sets of the digital signal to generate aggregated results;

scaling the aggregated results using selective ones of a plurality of coefficients to generate a plurality of linearly enhanced components of the digital signal;

aggregating the plurality of linearly enhanced components; and generating the reference component based on the aggregated plurality of linearly enhanced components.

* * * * *

UNITED STATES PATENT AND TRADEMARK OFFICE
CERTIFICATE OF CORRECTION

PATENT NO.        : 8,370,113 B2
APPLICATION NO.   : 12/152843
DATED             : February 5, 2013
INVENTOR(S)       : Roy G. Batruni Page 1 of 1

It is certified that error appears in the above-identified patent and that said Letters Patent is hereby corrected as shown below:

In the Claims

Column 15, lines 6-7, please replace "processor" with --processors--.
Column 16, line 8, please replace "system comprising:" with --system, comprising:--.
Column 16, line 12, please replace "block coupled" with --block, coupled--.

Signed and Sealed this
Thirtieth Day of July, 2013

Teresa Stanek Rea
*Acting Director of the United States Patent and Trademark Office*